United States Patent [19]

Okada et al.

[11] Patent Number: 5,302,545
[45] Date of Patent: Apr. 12, 1994

[54] METHOD OF MAKING CHARGE-COUPLED DEVICE AND SOLID-STATE IMAGING DEVICE HAVING AN ONO TRANSFER GATE INSULATING FILM

[75] Inventors: Hiroyuki Okada, Osaka; Wataru Kamisaka, Takatsuki; Masaji Asaumi, Takatsuki; Yuji Matsuda, Takatsuki, all of Japan

[73] Assignee: Matsushita Electronics Corporation, Kadoma, Japan

[21] Appl. No.: 73,137

[22] Filed: Jun. 7, 1993

Related U.S. Application Data

[62] Division of Ser. No. 797,307, Nov. 25, 1991, Pat. No. 5,241,198.

[30] Foreign Application Priority Data

Nov. 26, 1990 [JP] Japan .................. 2-324648

[51] Int. Cl.⁵ .......................................... H01L 21/339
[52] U.S. Cl. ........................................ 437/53; 437/920; 437/979
[58] Field of Search .............. 437/50, 53, 920, 941, 437/978, 979; 148/DIG. 43, DIG. 156, DIG. 163

[56] References Cited

U.S. PATENT DOCUMENTS

| | | | |
|---|---|---|---|
| 4,742,027 | 5/1988 | Blanchard et al. | 437/53 |
| 4,851,890 | 7/1989 | Miyatake | 437/53 |
| 4,859,624 | 8/1989 | Goto | 437/53 |

FOREIGN PATENT DOCUMENTS

| | | | |
|---|---|---|---|
| 0109865 | 9/1983 | European Pat. Off. | |
| 61-158170 | 7/1986 | Japan . | |
| 61-203670 | 9/1986 | Japan . | |
| 2-220450 | 9/1990 | Japan . | |
| 4017341 | 1/1992 | Japan | 437/53 |

OTHER PUBLICATIONS

European Patent Office–search report of 91120041.8, Apr. 10, 1992.

*Primary Examiner*—Brian E. Hearn
*Assistant Examiner*—Chandra Chaudhari
*Attorney, Agent, or Firm*—Ratner & Prestia

[57] ABSTRACT

A charge-coupled device comprises transfer gate electrodes separated from a substrate by a multilayer insulating film, and gate electrodes of MIS transistors separated from the substrate by a single layer insulating film. The multilayer insulating film comprising at least a lower silicon oxide layer of 10 nm to 200 nm thickness and an upper silicon nitride layer of 10 nm to 100 nm thickness. Since each of the gate insulating films of the MIS transistors is the same layer as the lower silicon oxide layer, there occurs no degradation in the transistor characteristics due to the surface states or the trapping states present within the silicon nitride layer.

3 Claims, 11 Drawing Sheets

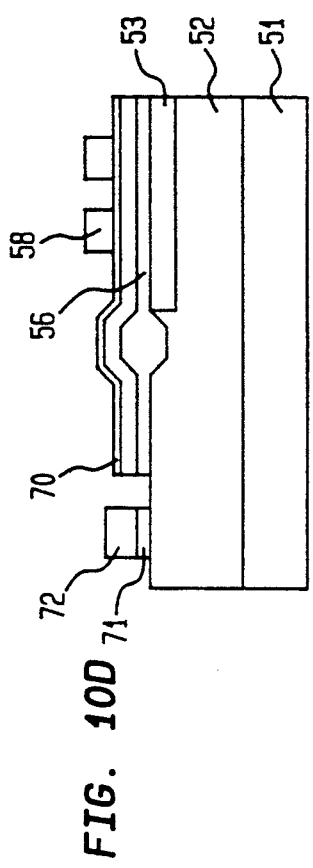
FIG. 10A
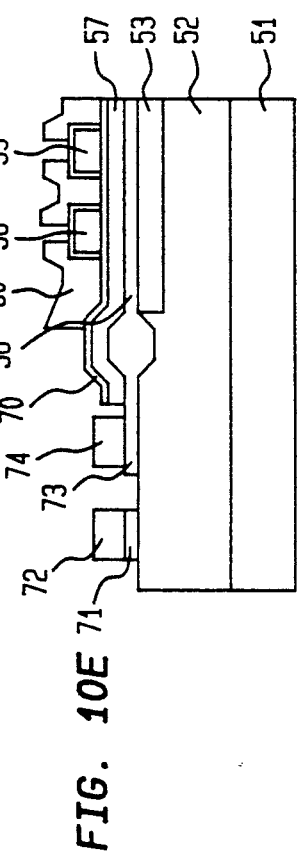
FIG. 10B
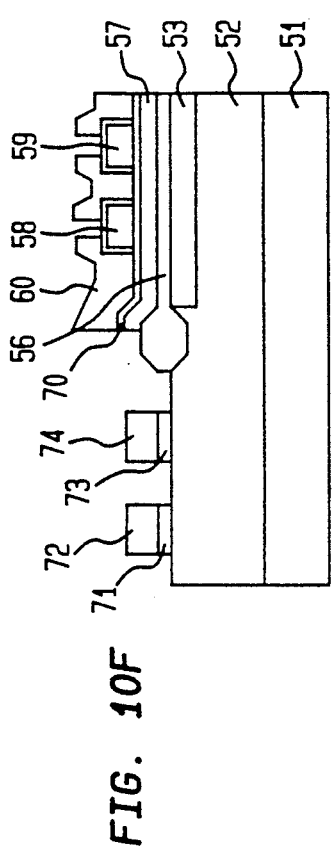
FIG. 10C
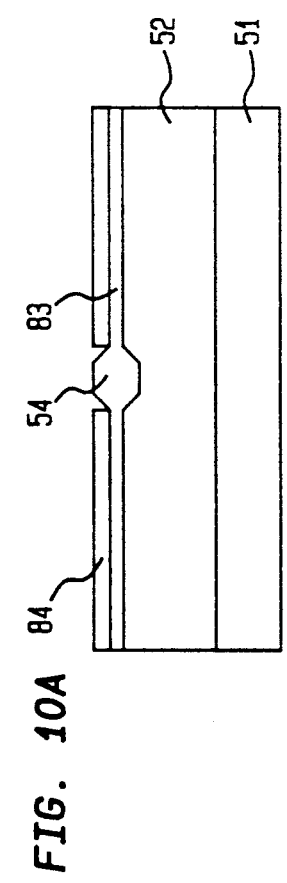
FIG. 10D
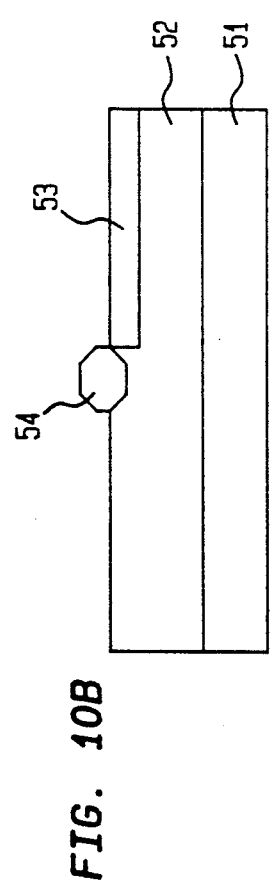
FIG. 10E
FIG. 10F

METHOD OF MAKING CHARGE-COUPLED DEVICE AND SOLID-STATE IMAGING DEVICE HAVING AN ONO TRANSFER GATE INSULATING FILM

This application is a division of application Ser. No. 07/797,307, now U.S. Pat. No. 5,241,198, filed Nov. 25, 1991.

BACKGROUND OF THE INVENTION

1. Field of the Invention

The present invention relates to a charge-coupled device used in a solid-state imaging sensor, a memory device, and a delay device. More particularly, the invention relates to a charge-coupled device having an ONO (oxide-nitride-oxide) transfer gate insulating film, specifically to a charge-coupled device and a solid-state imaging sensor designed to reduce the surface states in the peripheral circuit transistors; and to a method of manufacturing such devices.

2. Description of the Prior Art

In general, a charge-coupled device (CCD) comprises a semiconductor substrate, a buried transfer channel formed in the semiconductor substrate, a transfer gate insulating film formed on the semiconductor substrate, and transfer gate electrodes of two-level or three-level structure formed on the transfer gate insulating film. To enhance the transfer efficiency of charges along the buried transfer channel, a multilayer insulating film consisting of a silicon oxide layer, a silicon nitride layer, and a silicon oxide layer (the so-called ONO film) is often used for the transfer gate insulating film. In the charge-coupled devices in which the ONO film is used as the transfer gate insulating film, when forming second transfer gate electrodes, the formation of thick silicon oxide layers (the so-called gate bird's beak) under the edges of the first level transfer gate electrodes is prevented. Also, the dielectric strength of the ONO film is larger than that of a single silicon oxide layer.

Japanese Laid-Open Patent Publication No. 2-220450 discloses an example of a charge-coupled device using an ONO film as an gate insulating film. The charge-coupled device and the method of fabricating the same disclosed therein will be described below with reference to the accompanying drawings. FIG. 11 shows the prior art charge-coupled device. The charge coupled device comprises: a semiconductor substrate 3 which has a charge transfer block 1 and a peripheral circuit block 2; and an isolation oxide 4 for isolating the charge transfer block 1 from the peripheral circuit block 2. A multilayer insulating film 8 is formed on the charge transfer block 1. The multilayer insulating film 8 includes a silicon oxide layer 5 formed on the semiconductor substrate 3, a silicon nitride layer 6 formed on the silicon oxide layer 5, and a silicon oxide layer 7 formed on the silicon nitride layer 6. First transfer gate electrodes 9 are formed on the multilayer insulating film 8. A silicon oxide layer 10 is formed on the surface of the first transfer gate electrodes 9. Second transfer gate electrodes 11 are formed between the first transfer gate electrodes 9. A MIS (metal insulator semiconductor) transistor is formed on the peripheral circuit block 2. The MIS transistor comprises a gate insulating film 12 formed on the peripheral circuit block 2, a gate electrode 14 formed on the gate insulating film 12, source and drain regions 13 formed in the peripheral circuit block 2 of the semiconductor substrate 3.

As shown, on the charge transfer block 1, the multilayer insulating film 8 of the transfer gate is formed under the transfer gate electrodes 9 and 11, while on the other hand, the gate insulating film 12 of the peripheral circuit block 2 is formed from a single-layer insulating film. This construction is said to provide the effect that since the gate electrode in the peripheral circuit block 2 is provided with the single layer insulating film, it is easy to obtain the desired threshold voltage of a MIS transistor of the peripheral circuit block 2. Another one is that since the transfer gate electrodes 9 and 11 in the charge transfer block 1 are formed above the multilayer insulating film 8 having a high reliability, there is no possibility of causing pinholes in the multilayer insulating film 8.

FIGS. 12A through 12E show the process sequence for the fabrication of the charge-coupled device. The description below uses the same reference numerals as used in FIG. 11 to indicate the same parts or portions. First, the insulating film is formed to form the isolation oxide 4 on the semiconductor substrate 3, as shown in FIG. 12A. Next, the silicon oxide layer 5 is formed over the semiconductor substrate 3 by thermal oxidation. The silicon nitride layer 6 is formed on top of the silicon oxide layer 5 by CVD. Further, the silicon oxide layer 7 is formed on top of the silicon nitride layer 6, as shown in FIG. 12B.

Thereafter, the first transfer gate electrodes 9 are formed by CVD and selective etching. Further, the silicon oxide layers 10 are formed on the first transfer gate electrodes 9, as shown in FIG. 12C. Next, a resist 15 is applied over the entire surface of the charge transfer block 1. Using the resist 15 as a mask for etching, the multilayer insulating film 8 are removed from the peripheral circuit block 2, as shown in FIG. 12D.

Next, the surface of the semiconductor substrate 3 is thermally oxidized to form the gate insulating film 12 on the peripheral circuit block 2. Thereafter, using a second polysilicon, the transfer gate electrode 11 and the gate electrode 14 are formed. Finally, the source and drain 13 are formed in the peripheral circuit block 2, as shown in FIG. 12E.

The above prior art construction cannot be used for applications in which the MIS transistors are required to have different gate insulating film thicknesses for different purposes, for example, when transistors with a reduced resistance in "On" state at the time of switching and with thus reduced noise are formed together with transistors that are used only as resistors such as load transistors.

With the prior art fabrication method, the gate insulating film 12 of the peripheral circuit block 2 is fixed to a prescribed thickness and cannot be varied in thickness according to the purpose of the peripheral circuit.

The prior art method requires that the ONO film 8 in the peripheral circuit block 2 be removed before the formation of the gate insulating film 12 in the peripheral circuit block 2. As a result, the process becomes complicated. When the gate insulating film 12 is formed by an oxidation step, exposed portions of the ONO film between the first transfer gate electrodes 9 is also oxidized to form bird's beak encroaching the first transfer gate electrodes 9, thereby degrading the characteristics of the charge-coupled device. Furthermore, there occurs a difference in the thickness of the insulating film 7 between the portions below the first transfer gate electrodes 9 and the portions below the second transfer gate electrodes 11. This results in nonuniformity of the channel formed under the transfer gate electrodes 9 and 11, causing degradation in the reliability of characteristics as the charge-coupled device.

Also, the regions of the peripheral circuit block 2 from which the silicon nitride layer 4 has been removed are affected by the stress when the isolation oxide 4 is formed, which can lead to fatal damage to the characteristics of the peripheral circuit.

SUMMARY OF THE INVENTION

The charge-coupled device of this invention, which overcomes the above-discussed and numerous other disadvantages and deficiencies of the prior art, comprises: a semiconductor substrate having a top surface, said top surface having a charge transfer region and a peripheral circuit region; a transfer gate insulating film formed on said top surface of said semiconductor substrate, said transfer gate insulating film including at least two insulating layers and covering said charge transfer region; a plurality of transfer gate electrodes formed on said transfer gate insulating film; and at least one metal-insulator-semiconductor transistor formed at said peripheral circuit region, said transistor having a gate insulating film formed on said peripheral circuit region, said gate insulating film including at least one of said at least two insulating layers.

In a preferred embodiment, said at least two insulating layers comprises a silicon oxide layer formed on said charge transfer region, and a silicon nitride layer formed on said silicon oxide layer.

In a preferred embodiment, the thickness of said silicon oxide layer is 10 nm to 200 nm, and the thickness of said silicon nitride layer is 10 nm to 100 nm.

In a preferred embodiment, another silicon oxide layer is formed on said silicon nitride layer and said peripheral circuit region of said semiconductor substrate, and part of said another silicon oxide layer constitutes said gate insulating film.

According to the invention, a charge-coupled device comprises: a semiconductor substrate having a top surface, said top surface having a charge transfer region and a peripheral circuit region; a transfer gate insulating film formed on said top surface of said semiconductor substrate, said transfer gate insulating film including two insulating layers and covering said charge transfer region at least; a plurality of transfer gate electrodes formed on said transfer gate insulating film; at least one first metal-insulator-semiconductor transistor formed at said peripheral circuit region, said first metal-insulator-semiconductor transistor having a first gate insulating film formed on said peripheral circuit region, said first gate insulating film including at least one of said two insulating layers; and at least one second metal-insulator-semiconductor transistor formed at said peripheral circuit region, said second metal-insulator-semiconductor transistor having a second gate insulating film formed on said peripheral circuit region, the thickness of said second gate insulating film being different from that of said first gate insulating film.

In a preferred embodiment, said at least two insulating layers comprises a first silicon oxide layer formed on said charge transfer region, a silicon nitride layer formed on said first silicon oxide layer and a second silicon oxide layer formed on said silicon nitride layer, and part of said second silicon oxide layer constitutes said first gate insulating film.

In a preferred embodiment, the thickness of said silicon oxide layer is 10 nm to 200 nm, and the thickness of said silicon nitride layer is 10 nm to 100 nm.

According to the invention, a solid-state imaging sensor comprises: semiconductor substrate having a top surface, said top surface having a plurality of photodiodes regions and a plurality of charge transfer regions; a plurality of photodiodes each formed at a respective one of said plurality of photodiode regions, a plurality of transfer gate insulating films formed on said top surface of said semiconductor substrate, each of said transfer gate insulating films including at least two insulating layers and covering a respective one of said charge transfer regions, one of said two insulating layers covering a respective one of said photodiode region at least; and a plurality of transfer gate electrodes formed on said transfer gate insulating film.

According to the invention, a charge-coupled device comprises: a semiconductor substrate having a top surface, said top surface having a charge transfer region and a peripheral circuit region; a field isolation oxide disposed between said charge transfer region and said peripheral circuit region, said field isolation oxide surrounding said peripheral circuit region; an insulating film formed on said peripheral circuit region, said insulating film spaced away from an edge of said field isolation oxide by a distance; a transfer gate insulating film formed on said top surface of said semiconductor substrate, said transfer gate insulating film including at least two insulating layers and covering said charge transfer region; a plurality of transfer gate electrodes formed on said transfer gate insulating film; and at least one metal-insulator-semiconductor transistor formed at said peripheral region, said transistor having said gate insulating film, said gate insulating film including at least one of said at least two insulating layers.

In a preferred embodiment, said distance is more than the thickness of said field isolation oxide.

According to the invention, a method of fabricating a charge-coupled device comprises the steps of: forming a first silicon oxide layer on a top surface of a semiconductor substrate, said top surface having a charge transfer region and a peripheral circuit region; forming a silicon nitride layer on said first silicon oxide layer; forming at least one window through said silicon nitride layer and said first silicon oxide layer, said window exposing part of said peripheral circuit region; oxidizing said part of said peripheral circuit region and a surface of said silicon nitride layer for forming a second silicon oxide layer on said part of said peripheral circuit region and on said silicon nitride layer, thereby forming a transfer gate insulating film including said first silicon oxide layer, said silicon nitride layer and said second silicon oxide layer; and depositing a polysilicon film on said second silicon oxide layer, and patterning said polysilicon film of a plurality of transfer gate electrodes and at least one gate electrode, said transfer gate electrodes being over said charge transfer region and said at least one gate electrode being over said part of said peripheral circuit region.

According to the invention, a method of fabricating a charge-coupled device comprising the steps of: forming a field isolation oxide at a prescribed region of a top surface of a semiconductor substrate for dividing said top surface into a charge transfer region and a peripheral circuit region by said field isolation oxide; forming a first silicon oxide layer on said top surface of said semiconductor substrate; forming a silicon nitride layer on said first silicon oxide layer; removing a portion of said silicon nitride layer, said portion being at said periphery circuit region of said top surface of said semiconductor substrate, for exposing a surface of said first silicon oxide layer; removing a portion of said first silicon oxide layer, said portion being at said periphery circuit region of said top surface of said semiconductor substrate; forming a second silicon oxide layer on said silicon nitride layer for forming a transfer gate insulating film including said first silicon oxide layer, said silicon nitride layer and said second silicon oxide layer; forming a plurality of first transfer gate electrodes on said transfer gate insulating film and simultaneously forming a gate electrode on said second silicon oxide layer; forming a third silicon oxide layer at surfaces of said first transfer gate electrodes by oxidizing said surfaces of said first transfer gate electrodes; and forming a plurality of second transfer gate electrodes on said transfer gate insulating film and said third silicon oxide layer.

According the invention, a method of fabricating a charge-coupled device comprises the steps of: forming a field isolation oxide at a prescribed region of a top surface of a semiconductor substrate for dividing said top surface into a charge transfer region and a peripheral circuit region by said field isolation oxide; forming a first silicon oxide layer on said top surface of said semiconductor substrate; forming a silicon nitride layer on said first silicon oxide layer; removing a first portion of said silicon nitride layer, said first portion being at said periphery circuit region of said top surface of said semiconductor substrate, for exposing a surface of said first silicon oxide layer; removing a first portion of said first silicon oxide layer for exposing a surface of said semiconductor substrate, said first portion being at said periphery circuit region of said top surface of said semiconductor substrate; forming a second silicon oxide layer on said silicon nitride layer for forming a transfer gate insulating film including said first silicon oxide layer, said silicon nitride layer and said second silicon oxide layer; forming a plurality of first transfer gate electrodes on said transfer gate insulating film and simultaneously forming a first gate electrode on said second silicon oxide layer; removing a second portion of said silicon nitride layer, said second portion being at said periphery circuit region of said top surface of said semiconductor substrate, for exposing a surface of said first silicon oxide layer; removing a second portion of said first silicon oxide layer for exposing a surface of said semiconductor substrate, said second portion being at said periphery circuit region of said top surface of said semiconductor substrate; forming a third silicon oxide layer at surfaces of said first transfer gate electrodes by oxidizing said surfaces of said first transfer gate electrode; and forming a plurality of second transfer gate electrodes on said transfer gate insulating film and said third silicon oxide layer, and simultaneously forming a second gate electrode on said second silicon oxide layer.

According to the present invention, a charge-coupled device is presented which is provided with the desired dielectric strength and in which no degradation occurs in the transfer efficiency or the saturation characteristics for signal charges in the CCD channel.

Since the gate insulating film is formed in a prescribed thickness, the lower side value ($\phi$L) of the drive voltage is prevented from dropping, thereby causing degradation in the transfer efficiency. Furthermore, the higher side value ($\phi$H) of the drive voltage is prevented from increasing, and therefore, the pulse generator used for driving the device is not required to have an increased resistance to high voltage. Also, the films can be formed with good stability, contributing to the enhancement of the device reliability. Furthermore, no variations occur in the effective voltage applied to the CCD channel even when the charge-coupled device is used for an extended length of time.

In the charge-coupled device of the present invention, since the silicon nitride layer is removed, the stress caused to the entire charge-coupled device can be reduced. Also, when using this charge-coupled device as a solid-state imaging sensor, since there is no silicon nitride layer, the light falling on the photodiode does not suffer attenuation.

Also, since a single layer of silicon oxide is used as the gate insulating film of the MIS transistors, there occurs no degradation in the transistor characteristics due to the surface states or to the trapping states present in the insulating film. As a result, no degradation is caused in the noise and frequency characteristics of the MIS transistors due to an increase in the surface state density. Also, there are caused no variations in the threshold voltage Vth of the MIS transistors or degradation in the mutual conductance gm due to an increase in the trap density within the gate insulating film.

Further, the MIS transistors in the charge-coupled device of the present invention have low amplifier noise, which is about two-fifths that of conventional MIS transistors. This allows sufficient amplification of very weak signal charges in the operation of the charge-coupled device. Also, the frequency characteristics of the MIS transistors of the present invention can be enhanced to a level about 1.4 times higher than those of conventional MIS transistors. Furthermore, the gate insulating film of the MIS transistors in the peripheral circuit can be set to the optimum thickness according to the application. This facilitates the device miniaturization and the optimization of the device characteristics. Moreover, since the thickness of the gate insulating film of the MIS transistors can be chosen as desired, transistors with a reduced resistance in "on" state at the time of switching and thus reduced noise can be used together with transistors that are used only as resistors such as load transistors. Therefore, there is no possibility that the conductance gm increases, nor is there any need to increase the size of the transistors. This also serves to prevent the high frequency characteristics from degrading due to an increase in the addition capacitance.

Furthermore, since the silicon nitride layer is removed from the peripheral circuit block, it is possible to form the MIS transistors in the regions less susceptible to the disadvantage of the surface states. This prevents Vt from being adversely affected by the stress.

In the method of fabricating a charge-coupled device according to the present invention, since the gate insulating film formed on the peripheral circuit block is grown simultaneously on the charge transfer block having a silicon nitride layer on its top surface, the process is simplified and the thickness of the gate insulating film can be varied according to the purpose. Furthermore, the first transfer gate electrodes of the charge transfer block and the gate electrodes of the peripheral circuit can be formed in the process of self-alignment, which also serves to simplify the process. Also, when forming transistors of different purposes in the peripheral circuit, the gate insulating film of the peripheral circuit, the first transfer gate electrodes of the charge transfer block, and the gate electrodes of the peripheral circuit are formed in the process of the self-alignment in the charge transfer block, and then, the gate insulating film of the transistor of different purpose can be formed simultaneously with the insulating film that is used for electrically isolating the first transfer gate electrodes. At this time, the gate electrode of the transistor of different purpose and the second transfer gate electrodes can be formed simultaneously. This serves to simplify the process.

In the method of fabricating a charge-coupled device according to the present invention, the multilayer film consisting of silicon oxide layer and silicon nitride layer is removed before forming the gate insulating film on the peripheral circuit. As a result, the process is simplified as compared with the prior art method. Furthermore, the gate insulating film is formed on the peripheral circuit while the silicon nitride layer remains on the top surface of the charge transfer block. When the transfer gate insulating film is oxidized in this situation, no change is caused in the silicon nitride layer itself but only a silicon oxide layer of about 5 nm thickness is grown at the same time that the gate insulating film of the peripheral circuit is formed. As a result, the transfer gate insulating film is provided with a uniform thickness both under the first transfer gate electrodes and under the second transfer gate electrodes.

Thus, the invention described herein makes possible the objectives of:

(1) providing a charge-coupled device in which no degradation occurs in the device characteristics of the peripheral circuit due to surface states or to trapping states, the desired dielectric strength is provided, and no degradation occurs in the saturation characteristics;

(2) providing a charge-coupled device in which no degradation occurs in the transfer efficiency and which does not require that the pulse generator used be of a high voltage resistance type;

(3) providing a charge-coupled device that does not cause the light falling on photodiodes to suffer attenuation even when the device is used in a solid-state imaging sensor;

(4) providing a charge-coupled device having low amplifier noise and high frequency characteristics;

(5) providing a method of fabricating a charge-coupled device in which MIS transistors with a reduced resistance in "on" state at the time of switching and thus reduced noise are used together with transistors that are used only as resistors such as load transistors;

(6) providing a method of fabricating a charge-coupled device, which allows the thickness of gate insulating layers of MIS transistors in a peripheral circuit to be varied according to a respective purpose of the MIS transistor; and (7) providing a method of fabricating a charge-coupled device which is immune from the effect of the stress caused when an isolation oxide (LOCOS) is formed.

BRIEF DESCRIPTION OF THE DRAWINGS

This invention may be better understood and its numerous objects and advantages will become apparent to those skilled in the art by reference to the accompanying drawings as follows:

FIGS. 10A through 10F show a process sequence for fabricating a sixth embodiment of the present invention.

DESCRIPTION OF THE PREFERRED EMBODIMENTS

Figure 1:
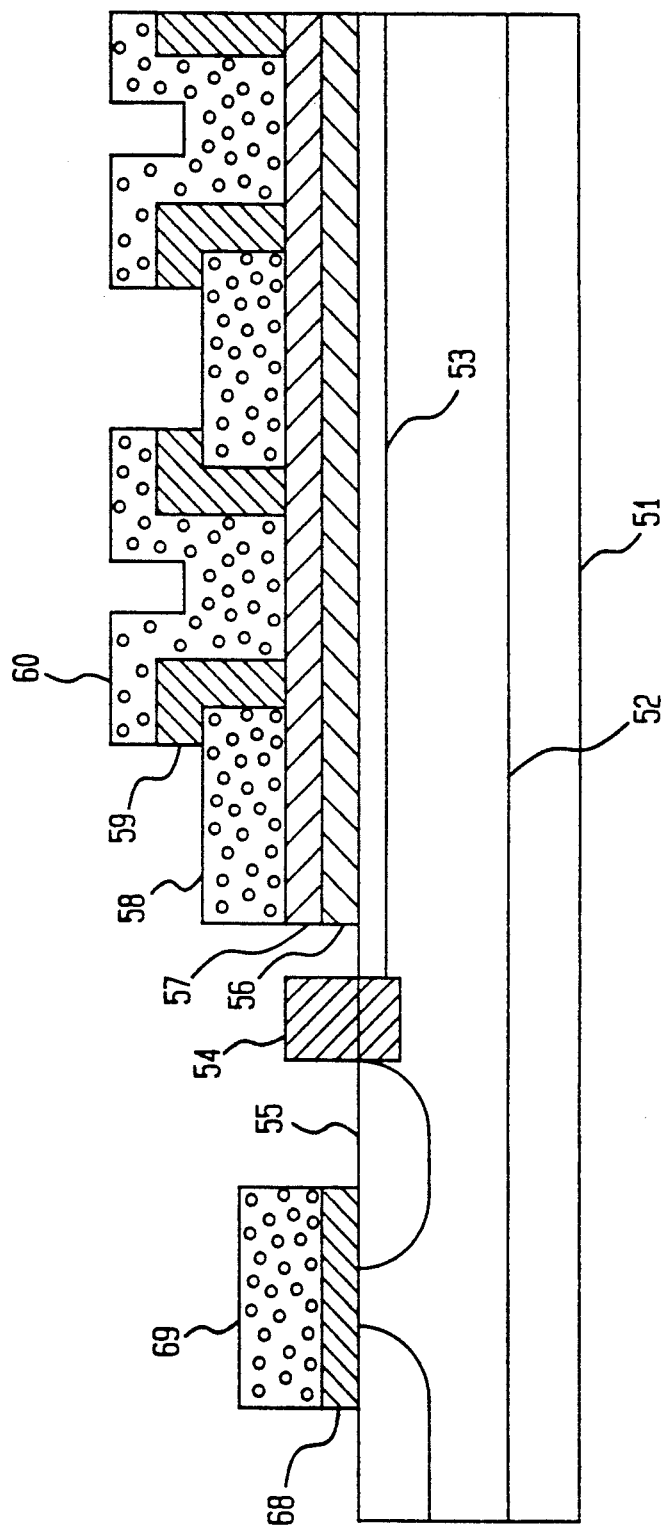
FIG. 1 shows a cross sectional view of a first embodiment of the present invention.

FIG. 1 shows a first embodiment of the present invention. In the cross section are shown one end of a buried-channel charge transfer block and a surface-channel MIS transistor that constitutes part of a peripheral circuit block.

A p-type diffusion layer 52 is formed in the surface of the principal plane of an n-type silicon substrate 51. The impurity concentration of the p-type diffusion layer 52 is 1 to $5 \times 10^{16}/cm^3$. The impurity concentration affects the transfer efficiency and the saturation capacitance of signal charges in the CCD channel hereinafter described. It is therefore important to maintain the impurity concentration within the specified range. The p-type diffusion layer 52 is formed to a depth of about 5 $\mu$m below the surface of the silicon substrate 51. The depth of the p-type diffusion layer 52 has a prescribed relationship with the breakdown voltage of a PN junction between the p-type diffusion layer 52 and the silicon substrate 51. Therefore, the depth is controlled to within a prescribed range, along with the impurity concentration, so that there will be no deterioration of the breakdown voltage.

In the region of the p-type diffusion layer 52 where the buried type charge transfer block is to be formed, there is formed an n-type diffusion layer 53 which acts as the CCD channel. The impurity concentration of the n-type diffusion layer 53 is 5 to $10 \times 10^{16}/cm^3$. As in the case of the p-type diffusion layer 52, the impurity concentration affects the transfer efficiency and the saturation capacitance of signal charges in the CCD channel. It is therefore important to maintain the impurity concentration within the specified range. Thus, the impurity concentration of the n-type diffusion layer 53 is related to that of the p-type diffusion layer 52. That is, the potentials applied to these layers are optimized so that the CCD channel is depleted. The n-type diffusion layer 53 is formed to a depth of about 0.5 $\mu$m below the surface of the silicon substrate 51. The depth of the n-type diffusion layer 53 is properly determined so that there occurs no degradation in the transfer efficiency or in the saturation capacitance.

The MIS transistor of the peripheral circuit is formed at an edge area of the surface of the silicon substrate 51. The MIS transistor and the buried-channel charge transfer block are electrically isolated from each other by an isolation oxide 54 formed from a thick oxide film called LOCOS. In the region of the MIS transistor, n-type diffusion layers 55 are formed which function as the source and drain of the MIS transistor, respectively.

A silicon oxide layer 56 is formed on the surface of the silicon substrate 51 in the region of the buried-channel charge transfer block. The formation of the silicon oxide layer 56, which acts as a transfer gate insulating film, is achieved by thermally oxidizing the surface of the silicon substrate 51 to a thickness of about 80 nm. The thickness of the silicon oxide layer 56 affects the transfer efficiency of the charge-coupled device and the saturation characteristics for signal charges in the CCD channel. The desirable thickness of the silicon oxide layer 56 is 10 nm to 200 nm. If the film thickness is smaller than 10 nm, the lower side value ($\phi L$) of the drive voltage drops, which means the pulse amplitude of the drive voltage is reduced. This causes degradation in the transfer efficiency. Conversely, if the film thickness is greater than 200 nm, the higher side value ($\phi H$) of the drive voltage increases, requiring the use of a pulse generator that can withstand the high voltage. This is extremely disadvantageous from the point of view of practical use. Also, if the drive voltage is to be reduced, it is necessary to decrease the impurity concentration of the n-type diffusion layer 53, which in turn causes the problem of reducing the saturation capacitance of signal charges in the CCD channel.

A silicon nitride layer 57 of 40 nm thickness is formed on the silicon oxide layer 56 by using low-pressure CVD. Thus, in the buried-channel charge transfer block, a multilayer film consisting of the silicon oxide layer 56 and the silicon nitride layer 57 is used as the transfer gate insulating film. The thickness of the silicon nitride layer 57 affects the dielectric strength of the charge-coupled device and the saturation characteristics of signal charges in the CCD channel. The desirable thickness of the silicon nitride layer 57 is 10 nm to 100 nm. If the film thickness is smaller than 10 nm, it not only deteriorates the dielectric strength but also affects the stability in film formation. This causes the problem of degrading the device reliability. Conversely, if the film thickness is greater than 100 nm, the overall thickness of the gate insulating film increases accordingly, causing an increase in the drive voltage or a decrease in the saturation capacitance of signal charges in the CCD channel, as in the case of an increased thickness of the silicon oxide layer 56. Also, the silicon nitride layer 57 contains a large amount of charge trapping states. The amount of trapping states increases as the thickness of the film increases, and therefore, when the charge-coupled device is operated for an extended length of time, the effective voltage applied to the CCD channel varies, which leads to degradation in the device reliability.

First transfer gate electrodes 58 are formed on the silicon nitride layer 57. The first transfer gate electrodes 58 are electrically isolated from their neighboring second transfer gate electrodes 60 by a silicon oxide layer 59. The transfer gate electrodes 58 and 60 are each formed from a polysilicon film doped with phosphorus. The thickness of the polysilicon film is preferably about 0.2 to 0.6 $\mu$m.

An important point here is to align the edge of the first transfer gate electrode 58 with the edge of the silicon nitride layer 57, so that the entire surface of the silicon nitride layer 57 is covered with the transfer gate electrodes 58 and 60 and the silicon oxide layer 59. By thus removing the silicon nitride layer 57 everywhere except under the gate electrodes 58 and 60 and the silicon oxide layer 59, it is possible to reduce the stress caused to the entire charge-coupled device.

Figure 2:
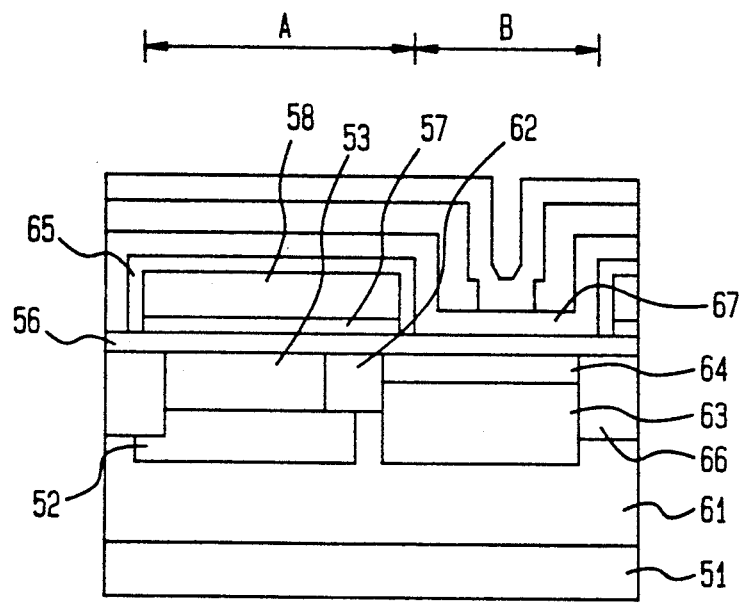
FIG. 2 shows a cross section of the charge-coupled device of the first embodiment adapted for use in a solid-state imaging sensor.

Furthermore, when using this charge-coupled device in a solid-state imaging sensor, since there are no silicon nitride layers over photodiodes integrated with the charge-coupled device, the light falling on the photodiodes does not suffer attenuation. To describe in more detail, a cross section of the charge-coupled device of this embodiment adapted for use in a solid-state imaging sensor is shown in FIG. 2.

As shown, a p-type diffusion layer 61 is formed to a certain depth below the surface of a silicon substrate 51. A charge transfer block A and a photodiode block B are formed in the p-type diffusion layer 61. The charge transfer block A includes a p-type diffusion layer 52 formed to a certain depth below the surface of the silicon substrate 51. On the p-type diffusion layer 52, there is formed an n-type diffusion layer 53 adjacent to which a diffusion layer 62 is formed.

Adjacent to the diffusion layer 62 is formed a photodiode. The photodiode consists of an n-type diffusion layer 63 formed to a substantial depth and a p-type diffusion layer 64 formed on top of the n-type diffusion layer 63 and at the surface of the silicon substrate 51. Usually, the light falling on the photodiode produces electron and hole pairs, thus enabling the light to be converted into electrical signals.

A silicon oxide layer 56 is formed over the entire surface of the silicon substrate 51. On the region of the silicon oxide layer 56 that substantially corresponds to the charge transfer block A, there is formed a silicon nitride layer 57. Polysilicon that forms a transfer gate electrode 58 is deposited on top of the silicon nitride layer 57. Further, a silicon oxide layer 65 is formed in encircling relationship to the transfer gate electrode 58. In the solid-state imaging sensor, electrical signals produced from the light falling on the photodiode are transferred along the channel below the transfer gate electrode 58.

The construction is such that the transfer gate electrode 58 and the photodiode are paired together. The solid-state imaging sensor consists of a plurality of such pairs. Each of the paired devices is electrically isolated from its neighboring paired device by a diffusion layer 66. Each photodiode is formed below an open region 67 of the silicon substrate 51 between one transfer gate electrode 58 and its neighboring transfer gate electrode (not shown). Only the silicon oxide layer 56 is left on the region of the silicon substrate 51 under which the photodiode is formed. When using a multilayer gate insulating film for the transfer gate electrode 58, as described above, it has been a usual practice to leave the multilayer film above the photodiode, but this has caused the effect of attenuating the entering light. With such a method, it has been difficult to meet the need for increased sensitivity of the solid-state imaging sensor.

Referring back to FIG. 1, the transistor device formed in the MIS transistor region is an ordinary MIS transistor. That is, a silicon oxide layer 68 that acts as the gate insulating film is formed to a thickness of 50 nm on the surface of the silicon substrate 51 between source and drain, and a gate electrode 69 is formed on the silicon oxide layer 68. The gate electrode 69 is formed from a polysilicon film doped with phosphorus, the film thickness being about 0.2 to 0.6 μm.

In the thus constructed charge-coupled device, no adverse effects will be caused to the transfer characteristic even when the multilayer film of silicon oxide and silicon nitride is used as the gate insulating film for the buried-channel charge transfer block. On the other hand, if such a multilayer film of silicon oxide and silicon nitride is used as the gate insulating film for the MIS transistor constituting part of the peripheral circuit, the transistor characteristics will deteriorate because of the surface states caused in the multilayer film and the trapping states present in the insulating film, which is not the case with the present embodiment in which a single layer of silicon oxide is used as the gate insulating film. More specifically, the noise and frequency characteristics of the MIS transistor deteriorate as the surface state density in the multilayer film increases. Furthermore, the increased trap density in the film will cause the threshold voltage Vth of the MIS transistor to shift and the mutual conductance gm to deteriorate. These factors combine to deteriorate the reliability of the charge-coupled devices using a multilayer film. In the charge-coupled device of the present embodiment, on the other hand, there is no such concern of device characteristic degradation as has been the case with the MIS transistor having the multilayer gate insulating film.

Figure 3:
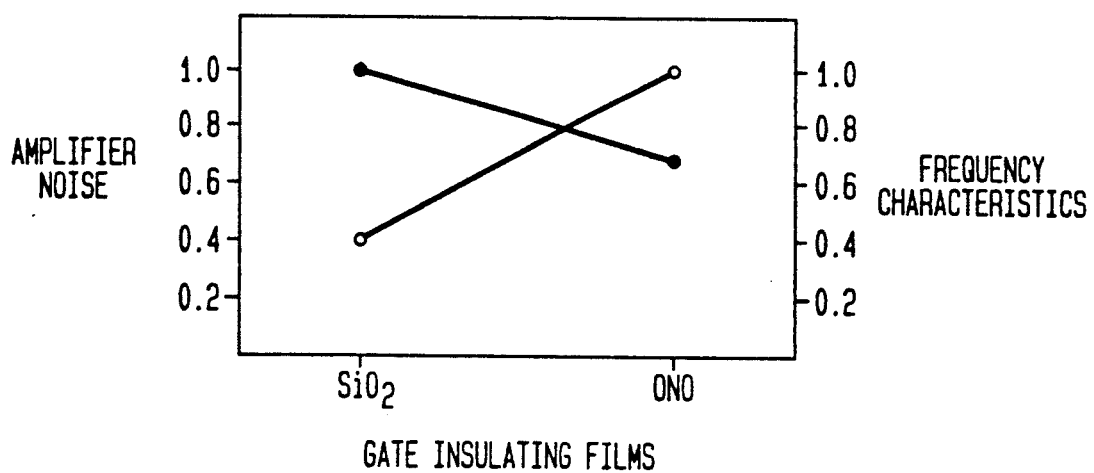
FIG. 3 is a graph showing a comparison between the first embodiment and a prior art charge-coupled device with respective to amplifier noise and frequency characteristics.

For detailed explanation of the above-described effects, reference is now made to FIG. 3 in which the amplifier noise and frequency characteristics are compared between the charge-coupled device of the present embodiment and the prior art charge-coupled device containing MIS transistors having a multilayer gate insulating film, to see how the characteristics are affected by different types of amplifier gate insulating film. In the figure, the black dot indicates the frequency characteristics and the white dot represents the amplifier noise. The gate insulating film type reading $SiO_2$ indicates the MIS transistor of the present embodiment, and ONO the MIS transistor of the prior art. As shown, in the MIS transistor of the present embodiment, the amplifier noise is low, its level being about two-fifths that of the prior art MIS transistor. This allows sufficient amplification of very weak signal charges in the operation of the charge-coupled device. As for the frequency characteristics, in the MIS transistor of the present invention, the level can be enhanced to a level about 1.4 times higher than that of the prior art MIS transistor.

Figure 4:
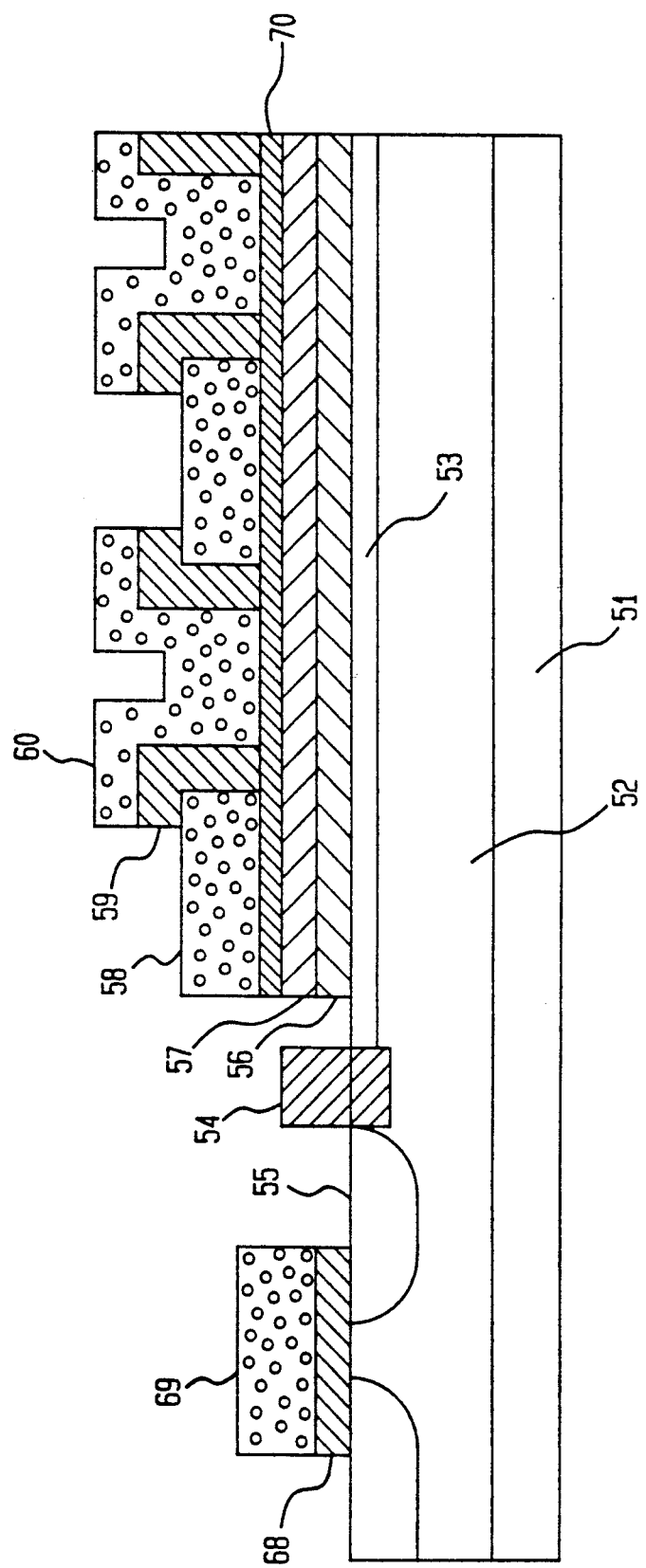
FIG. 4 shows a cross-sectional view of a second embodiment of the present invention.

FIG. 4 shows a second embodiment of the present invention. In the cross section are shown one end of a buried-channel charge transfer block and a surface-channel MIS transistor that constitutes part of a peripheral circuit block. The second embodiment differs from the first embodiment in that the multilayer film provided above the CCD channel includes an additional silicon oxide layer deposited on top of the silicon nitride layer, thus forming a multilayer film generally known as the ONO film.

To describe specifically, a p-type diffusion layer 52 is formed in the surface of the principal plane of a silicon substrate 51. In the region of the p-type diffusion layer 52 where the buried-channel charge transfer block is to be formed, there is formed an n-type diffusion layer 53 which acts as the CCD channel.

A MIS transistor is formed at an edge area of the surface of the silicon substrate 51. The MIS transistor and the buried-channel charge transfer block are electrically isolated from each other by an isolation region 54 called LOCOS. In the region of the MIS transistor, n-type diffusion layers 55 are formed which function as the source and drain of the MIS transistor, respectively.

A silicon oxide layer 56 is formed on the surface of the silicon substrate 51 in the region of the buried-channel charge transfer block. The formation of the silicon oxide layer 56, which acts as a transfer gate insulating film, is achieved by thermally oxidizing the surface of the silicon substrate 51 to a thickness of about 80 nm. A silicon nitride layer 57 of 40 nm thickness is formed on the silicon oxide layer 56 by using low-pressure CVD. Further, a silicon oxide layer 70 is formed on top of the silicon nitride layer 57. The thickness of the silicon oxide layer 70 is about 5 nm. The silicon oxide layer 70 is formed, in the fabrication process hereinafter described, simultaneously with the formation of a silicon oxide layer that acts as the gate insulating film of the MIS transistor.

The silicon oxide layer 56 and silicon nitride layer 57 are formed one on top of the other in the charge transfer region prior to the formation of the gate insulating film for the MIS transistor. When a silicon oxide layer 68 is formed to form the gate insulating film of the MIS transistor, the surface of the silicon nitride layer 57 is oxidized to a thickness of 5 nm. The thickness of an oxide film formed at the surface of the silicon nitride layer 57 varies as the silicon oxide layer 68 of the MIS transistor is varied. However, the oxide film thickness is not greater than several tens of nanometers.

The use of the ONO film as the transfer gate insulating film for the charge-coupled device serves to enhance the reliability in terms of dielectric strength. Moreover, since the insulating film of the transfer gate is formed from a multilayer film consisting of two or more layers, the thickness of the insulating film is the same at any given transfer gate electrode. This prevents potential variations between transfer gate electrodes. Usually, the insulating film under the transfer gate electrodes is subjected to excessive oxide growth called "bird's beak" under the edges of the gates during oxidation in the subsequent step. However, when the multilayer film is used as the gate insulating film as in the present embodiment, no bird's beak encroachment occurs in the subsequent oxidation, thus allowing the formation of a uniform channel. In addition, the same effects as described in conjunction with the first embodiment also are obtained.

First transfer gate electrodes 58 are formed on the silicon nitride layer 57. The first transfer gate electrodes 58 are electrically isolated from their neighboring second transfer gate electrodes 60 by a silicon oxide layer 59. Each of the transfer gate electrodes 58 and 60 is formed from a polysilicon film doped with phosphorus. The thickness of the polysilicon film is about 0.2 to 0.6 μm. The edge of the transfer gate electrodes 58 is aligned with that of the silicon nitride layer 57.

The transistor formed in the MIS transistor region is an ordinary MIS transistor. The silicon oxide layer 68 that acts as the gate insulating film is formed to a thickness of 50 nm on the surface of the silicon substrate 51 between source and drain, and a gate electrode 69 is formed on the silicon oxide layer 68. The gate electrode 69 is formed from a polysilicon film doped with phosphorus, the film thickness being about 0.2 to 0.6 μm.

In the thus constructed charge-coupled device, no adverse effects will be caused to the transfer characteristic even when the multilayer film of silicon oxide layer and silicon nitride layer is used as the gate insulating film for the buried-channel charge transfer block. On the other hand, if such a multilayer film of silicon oxide, silicon nitride, and silicon oxide is used as the gate insulating film for the MIS transistor which constitutes part of the peripheral circuit, as in the prior art charge-coupled device, the transistor characteristics will deteriorate because of the surface states caused in the multilayer film and the trapping states present in the insulating film, which is not the case with the present embodiment in which a single layer of silicon oxide is used as the gate insulating film. More specifically, the noise and frequency characteristics of the MIS transistor deteriorate as the surface state density in the multilayer film increases. Furthermore, the increased trap density in the film will cause the threshold voltage Vth of the MIS transistor to shift and the mutual conductance gm to deteriorate. These factors combine to deteriorate the reliability of the charge-coupled device using a multilayer film. In the charge-coupled device of the present embodiment, on the other hand, there is no such concern of device characteristic degradation as has been the case with the MIS transistor in the prior art charge-coupled device.

Figure 5:
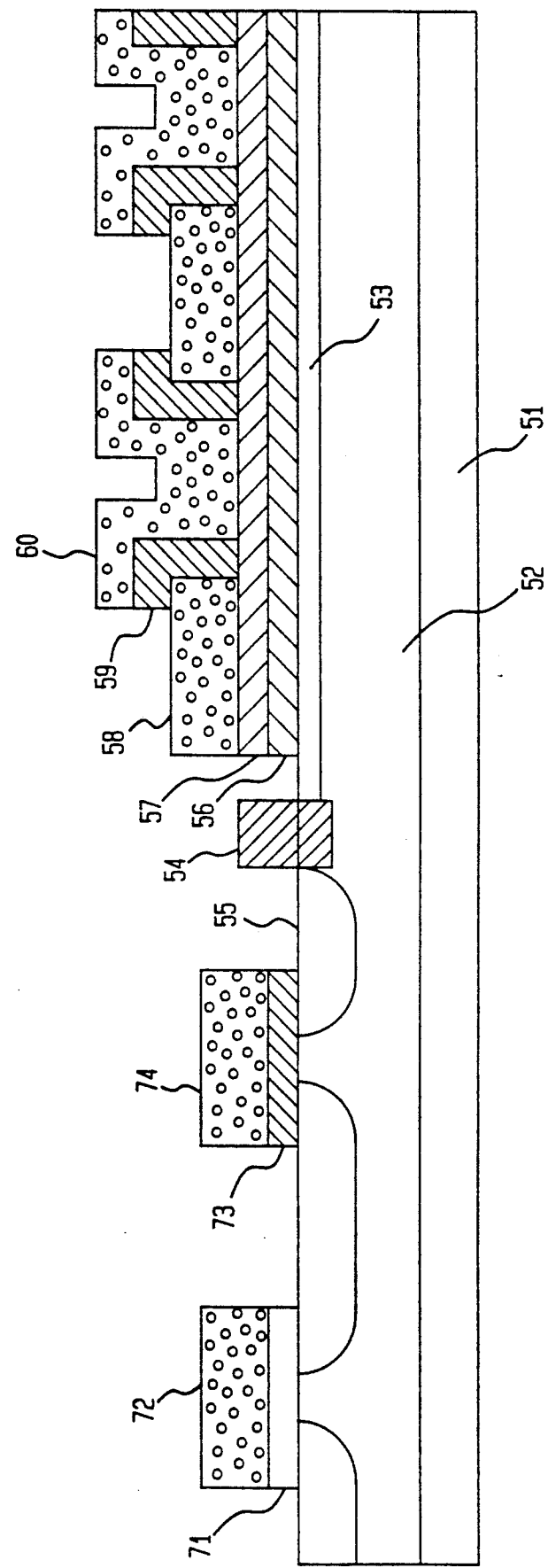
FIG. 5 shows a cross-sectional view of a third embodiment of the present invention.

FIG. 5 shows a third embodiment of the present invention. In the cross section are shown one end of a buried-channel charge transfer block and a surface-channel MIS transistor that constitutes part of a peripheral circuit block.

A p-type diffusion layer 52 is formed in the surface of the principal plane of an n-type silicon substrate 51. The impurity concentration of the p-type diffusion layer 52 is 1 to $5 \times 10^{16}$/cm$^3$. The impurity concentration affects the transfer efficiency and the saturation capacitance of signal charges in the CCD channel. It is therefore important to maintain the impurity concentration within the specified range.

The p-type diffusion layer 52 is formed to a depth of about 5 μm below the surface of the silicon substrate 51. The depth of the p-type diffusion layer 52 is determined according to the impurity concentration and to the voltage to be applied so that there occurs no degradation in the dielectric strength with respect to the silicon substrate 51.

In the region of the p-type diffusion layer 52 where the buried-channel charge transfer block is to be formed, there is formed an n-type diffusion layer 53 which acts as the CCD channel. The impurity concentration of the n-type diffusion layer 53 is 5 to $10 \times 10^{16}$/cm$^3$. Since the impurity concentration affects the saturation capacitance of signal charges in the CCD channel hereinafter described, it is important to maintain the impurity concentration within the specified range. Also, the impurity concentration of the n-type diffusion layer 53 is related to that of the p-type diffusion layer 52, and the potentials applied to these layers are optimized so that the CCD channel is depleted. The n-type diffusion layer 53 is formed to a depth of about 0.5 μm below the surface of the silicon substrate 51. The depth of the n-type diffusion layer 53 is properly determined according to the impurity concentration so that there occurs no degradation in the breakdown voltage with respect to the silicon substrate 51.

A MIS transistor is formed at an edge area of the surface of the silicon substrate 51. The MIS transistor and the buried-channel charge transfer block are electrically isolated from each other by an isolation oxide 54 called LOCOS. In the region of the MIS transistor, n-type diffusion layers 55 are formed which function as the source and drain, respectively.

A silicon oxide layer 56 is formed on the surface of the silicon substrate 51 in the region of the buried-channel charge transfer block. The formation of the silicon oxide layer 56, which acts as a gate insulating film, is achieved by thermally oxidizing the surface of the silicon substrate 51 to a thickness of about 80 nm. The thickness of the silicon oxide layer 56 affects the transfer efficiency of the charge-coupled device and the saturation characteristics for signal charges in the CCD channel. The desirable film thickness is 10 nm to 200 nm. The film thickness should be set within this specified range for the same reasons as described in connection with the first embodiment.

A silicon nitride layer 57 is formed to a thickness of 40 nm on the silicon oxide layer 56 by using low-pressure CVD. Thus, in the buried-channel charge transfer block, a multilayer structured film consisting of the silicon oxide layer 56 and the silicon nitride layer 57 is used as the gate insulating film.

The thickness of the silicon nitride layer 57 affects the breakdown voltage of the charge-coupled device and the saturation characteristics for signal charges in the CCD channel. The desirable film thickness is 10 nm to 100 nm. This film thickness should also be set within the specified range for the same reasons as described in connection with the first embodiment.

First transfer gate electrodes 58 are formed on the silicon nitride layer 57. The first transfer gate electrodes 58 are electrically isolated from their neighboring second transfer gate electrodes 60 by silicon oxide layers 59. Each of the transfer gate electrodes 58 and 60 is formed from a polysilicon film doped with phosphorus. The thickness of the polysilicon film is about 0.5 μm.

The transistor formed in the MIS transistor region is an ordinary MIS transistor. A silicon oxide layer 71 that acts as the gate insulating film is formed to a thickness of 50 nm on the surface of the n-type diffusion layer 52 between source and drain, and a gate electrode 72 is formed on the silicon oxide layer 71. The gate electrode 72 is formed from a polysilicon film doped with phosphorus. The polysilicon film thickness is about 0.5 μm.

Another MIS transistor is formed sharing the common source or drain with the above MIS transistor. This other MIS transistor comprises a silicon oxide layer 73, the gate insulating film, formed to a thickness of 100 nm on the surface of the p-type diffusion layer 52, and a gate electrode 74 formed on the silicon oxide layer 73. The gate electrode 74 is formed from a polysilicon film doped with phosphorus. The polysilicon film thickness is about 0.4 μm. The difference between the two MIS transistors is that the silicon oxide layers 71 and 73, the gate insulating films, are different in thickness.

In the thus constructed charge-coupled device, the gate insulating film for the buried-channel charge transfer block is formed from a multilayer film, and MIS transistors having at least gate insulating films of two different thicknesses are formed in the peripheral circuit.

If the gate insulating films of the MIS transistors in the peripheral circuit (especially in amplifier blocks, for example) are formed from a thin film of the same thickness, it is not possible to design the MIS transitors with the desired characteristics depending on the purpose of the peripheral circuit. For example, with a MIS transistor having a thin gate insulating film, the resistance in "on" state at the time of switching of the transistor is low and noise can be reduced, which contributes to enhancing the device characteristics. However, if this MIS transistor is to be used only as a resistor, such as a load transistor, the conductance gm increases. In the case of a thin gate insulating film, in order to give the desired resistance, the size of the transistor to be formed has to be increased. Therefore, if MIS transistors of different purposes are to be formed in the peripheral circuit, it is essential that each MIS transistor be provided with a gate insulating film of the desired thickness that can meet its specific purpose. Furthermore, in such a peripheral circuit, addition capacitance also increases, which works against the characteristics at high frequencies.

The present embodiment allows the formation of MIS transistors having the optimum gate insulating film thickness according to their purposes. This facilitates reduction in the device size and optimization of the device characteristics.

In the thus constructed charge-coupled device, even when a multilayer film of silicon oxide and silicon nitride is used as the gate insulating film for the buried-channel charge transfer block, the transfer characteristics will remain virtually undisturbed. On the other hand, when such a multilayer film is used as the gate insulating film for the MIS transistors which constitute the peripheral circuit, the transistor characteristics will deteriorate because of the surface states caused in the multilayer film and the trapping states present in the insulating film, which is not the case with the present embodiment in which a single layer of silicon oxide is used as the gate insulating film. In the charge-coupled device of the present embodiment, no such degradation occurs in the characteristics of the MIS transistors in the charge-coupled device.

Figure 6:
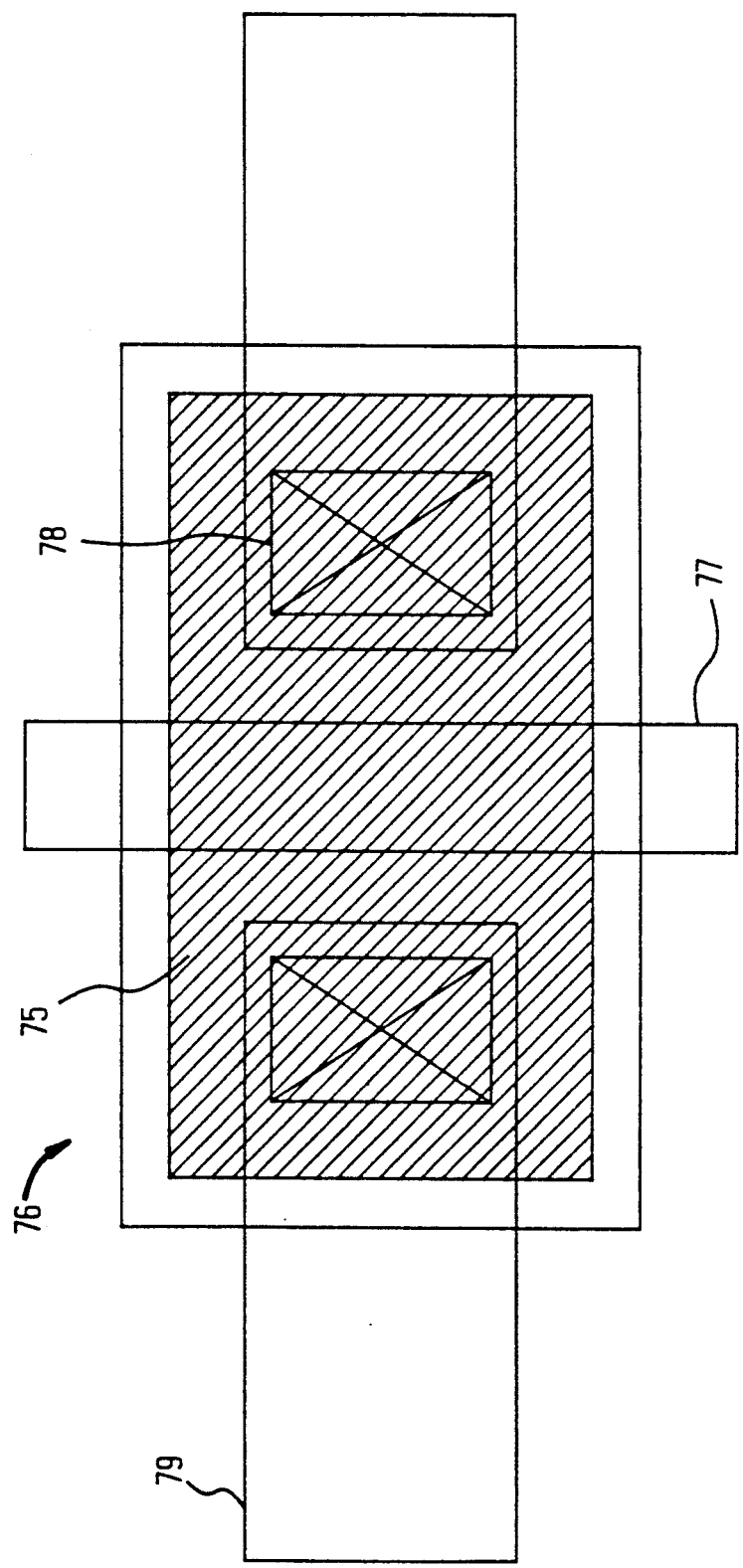
FIG. 6 shows a plan view of a MIS transistor in a peripheral circuit of the embodiments of the present invention.

FIG. 6 shows a MIS transistor on the peripheral circuit, illustrating the region of the transistor where the silicon nitride layer is removed. The region 75 indicated by oblique hatching is the region where the silicon nitride layer is removed. The MIS transistor is formed on the surface of an n-type diffusion layer in a silicon substrate. An isolation oxide 76 called LOCOS is provided to electrically isolate the MIS transistor from its neighboring devices (not shown in FIG. 6). The isolation oxide 76 is formed around a rectangular shaped region. The oblique hatching region 75 is also rectangular in shape but a little smaller than the rectangular shaped region of the isolation oxide 76.

A gate electrode 77 is formed approximately in the center of the area inside the isolation oxide 76. Two n-type diffusion layers are formed on both sides of the gate electrode 77, to form the source and drain regions of the MIS transistor. Contact holes 78 for the source and drain are opened by etching through prescribed regions of a protective film in the uppermost layer of the MIS transistor. Wiring patterns 79 are formed to make connections through the contact holes 78 to diffusion regions of the source and drain, respectively.

The region of the peripheral circuit where the silicon nitride layer is removed is to be at a prescribed position where the effect of surface states can be minimized. That is, the region is to be at a planar portion that is not affected by the stress caused during the formation of the isolation oxide 76 known as LOCOS. Such a planar portion should be spaced away from the edges of the isolation oxide 76 at least by a distance equivalent to the combined thickness of the isolation oxide 76 and the silicon oxide layer a portion of which is removed during the etching of the silicon nitride layer.

In the first embodiment, the film thickness of the isolation oxide 76 is 500 nm and that of the silicon oxide layer to be etched away is 80 nm. Therefore, if the planar portion is spaced away at least 0.58 μm from the edges of the isolation oxide 76, the effect of the stress can be avoided effectively. If the peripheral circuit is formed in a region subjected to the effect of the stress, the surface states increase, causing reliability problems such as deterioration of threshold voltage Vt.

Figure 7:
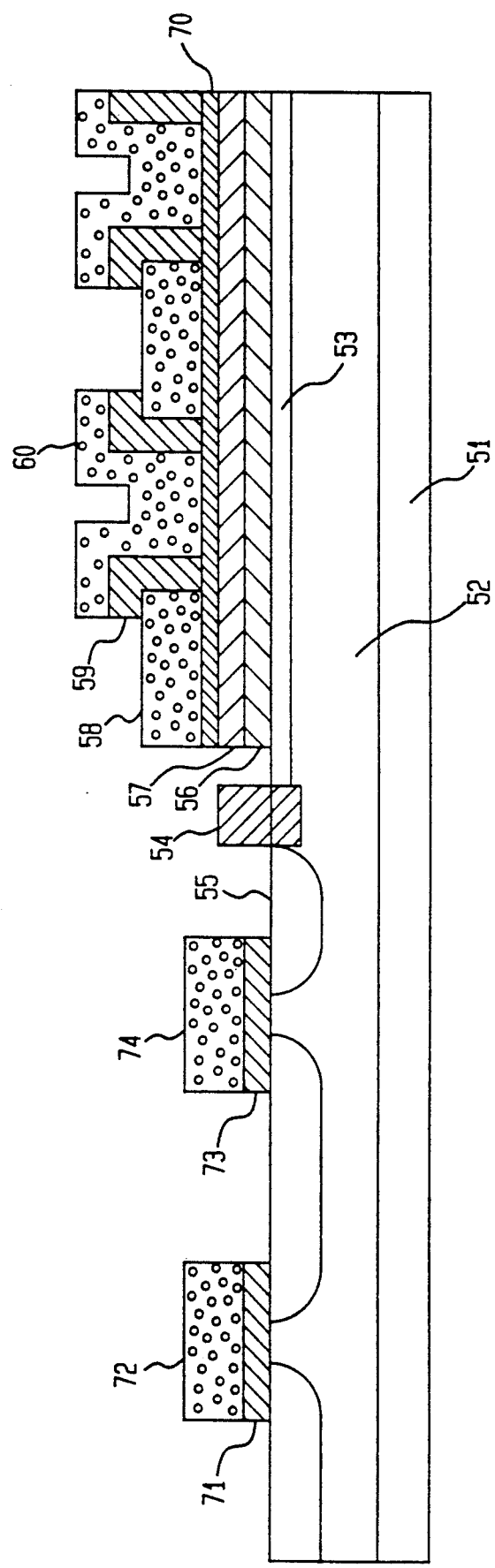
FIG. 7 shows a cross-sectional view of a fourth embodiment of the present invention.

FIG. 7 shows a fourth embodiment of the present invention. In the cross section are shown one end of a buried-channel charge transfer block and a surface-channel MIS transistor that constitutes part of a peripheral circuit block. The fourth embodiment differs from the third embodiment in that the multilayer film provided above the CCD channel includes an additional silicon oxide layer deposited on top of the silicon oxide and silicon nitride layers, thus forming a multilayer film generally known as the ONO film.

To describe specifically, a p-type diffusion layer 52 is formed in the surface of the principal plane of a silicon substrate 51. In the region of the p-type diffusion layer 52 where the buried-channel charge transfer block is to be formed, there is formed an n-type diffusion layer 53 which acts as the CCD channel.

A MIS transistor is formed at an edge portion of the surface of the silicon substrate 51. The MIS transistor and the buried-channel charge transfer block are electrically isolated from each other by an isolation oxide 54 formed from a thick oxide film called LOCOS. In the region of the MIS transistor, n-type diffusion layers 55 are formed as the source and drain, respectively.

A silicon oxide layer 56 is formed on the surface of the silicon substrate 51 in the region of the buried-channel charge transfer block. The formation of the silicon oxide layer 56, which acts as a gate insulating film, is achieved by thermally oxidizing the surface of the silicon substrate 51 to a thickness of about 80 nm.

A silicon nitride layer 57 of 40 nm thickness is formed on the silicon oxide layer 56 by using low-pressure CVD. Such a three-layer film is generally known as the ONO film. Further, a silicon oxide layer 70 is formed on top of the silicon nitride layer 57. The thickness of the silicon oxide layer 70 is about 5 nm. The silicon oxide layer 70 is formed, in the fabrication process hereinafter described, simultaneously with the formation of a silicon oxide layer that acts as the gate insulating film for the MIS transistor.

The silicon oxide layer 56 and silicon nitride layer 57 are formed one on top of the other in the charge transfer region prior to the formation of the gate insulating film for the MIS transistor. When a silicon oxide layer 71 is formed as the gate insulating film, the surface of the silicon nitride layer 57 is oxidized to a thickness of 5 nm. This film thickness can be varied as the gate insulating film thickness of the MIS transistor is varied. However, the oxide film thickness is not greater than several tens of nm.

The use of the ONO film as the transfer gate insulating film for the charge-coupled device serves to enhance the reliability in terms of dielectric strength. Moreover, since the transfer gate electrode is formed on a multilayer film consisting of two or more layers, the thickness of the insulating film is the same at any given transfer gate electrode. This prevents potential variations between the transfer gate electrodes. Usually, the insulating film under the transfer gate electrodes is subjected to excessive oxide growth called "bird's beak" under the edges of the first transfer gate electrodes during oxidation in the subsequent step. However, when the multilayer film is used as the transfer gate insulating film as in the present embodiment, no bird's beak encroachment occurs in the subsequent oxidation, thus forming a uniform channel.

First transfer electrodes 58 are formed on the silicon oxide layer 70. The first transfer electrodes 58 are electrically isolated from their neighboring transfer electrodes 60 by silicon oxide layers 59. The transfer electrodes 58 and 60 are each formed in a polysilicon film doped with phosphorus. The thickness of the polysilicon film is about 0.5 μm.

An ordinary MIS transistor is formed in the MIS transistor region. That is, the silicon oxide layer 71 that acts as the gate insulating film is formed to a thickness of 50 nm on the surface of the n-type diffusion layer 52 between source and drain, and a gate electrode 72 is formed on the silicon oxide layer 71. The gate electrode 72 is formed from a polysilicon film doped with phosphorus. The polysilicon film thickness is about 0.5 μm.

Another MIS transistor shares the common source or drain with the MIS transistor. This MIS transistor comprises a silicon oxide layer 73, the gate insulating film, formed to a thickness of 100 nm on the surface of the p-type diffusion layer 52, and a gate electrode 74 formed on the silicon oxide layer 73. The gate electrode 74 is formed from a polysilicon film doped with phosphorus. The polysilicon film thickness is about 0.4 μm. The difference between the two MIS transistors is that the silicon oxide layers 71 and 73, the gate insulating films, are different in thickness.

In the thus constructed charge-coupled device, the gate insulating film for the buried-channel charge transfer block is formed from a multilayer film, and MIS transistors having gate insulating films of at least two different thicknesses are formed in the peripheral circuit.

If the gate insulating films of the MIS transistors in the peripheral circuit (especially in amplifier blocks, for example) are formed from a thin film of the same thickness, it is not possible to design the MIS transistors with the desired characteristics depending on the purpose of the peripheral circuit. For example, with a MIS transistor having a thin gate insulating film, the resistance in "on" state at the time of switching of the transistor is low and noise can be reduced, which contributes to enhancing the device characteristics. However, if this MIS transistor is used only as a resistance, such as a load transistor, the conductance gm increases. In the case of a thin gate insulating film, in order to give the desired resistance, the size of the transistor to be formed has to be increased. Therefore, if MIS transistors for different purposes are formed in the peripheral circuit, it is essential that each MIS transistor be provided with a gate insulating film of the desired thickness that can meet its specific purpose. Furthermore, in such a peripheral circuit, addition capacitance also increases, which works against the characteristics at high frequencies.

The present embodiment allows the formation of MIS transistors having the optimum gate insulating film thickness according to their purposes. This facilitates reduction in the device size and optimization of the device characteristics.

In the thus constructed charge-coupled device, even when a multilayer film of silicon oxide and silicon nitride is used as the gate insulating film for the buried-channel charge transfer block, the transfer characteristics will remain virtually undisturbed. On the other hand, if such a multilayer film is used as the gate insulating film for the MIS transistors which constitute the peripheral circuit, the transistor characteristics will deteriorate because of the surface states caused in the multilayer film and the trapping states present in the insulating film, which is not the case with the present embodiment in which a single layer of silicon oxide is used as the gate insulating film. In the charge-coupled device of the present embodiment, no such degradation occurs in the characteristics of the MIS transistors in the charge-coupled device.

Figure 8:
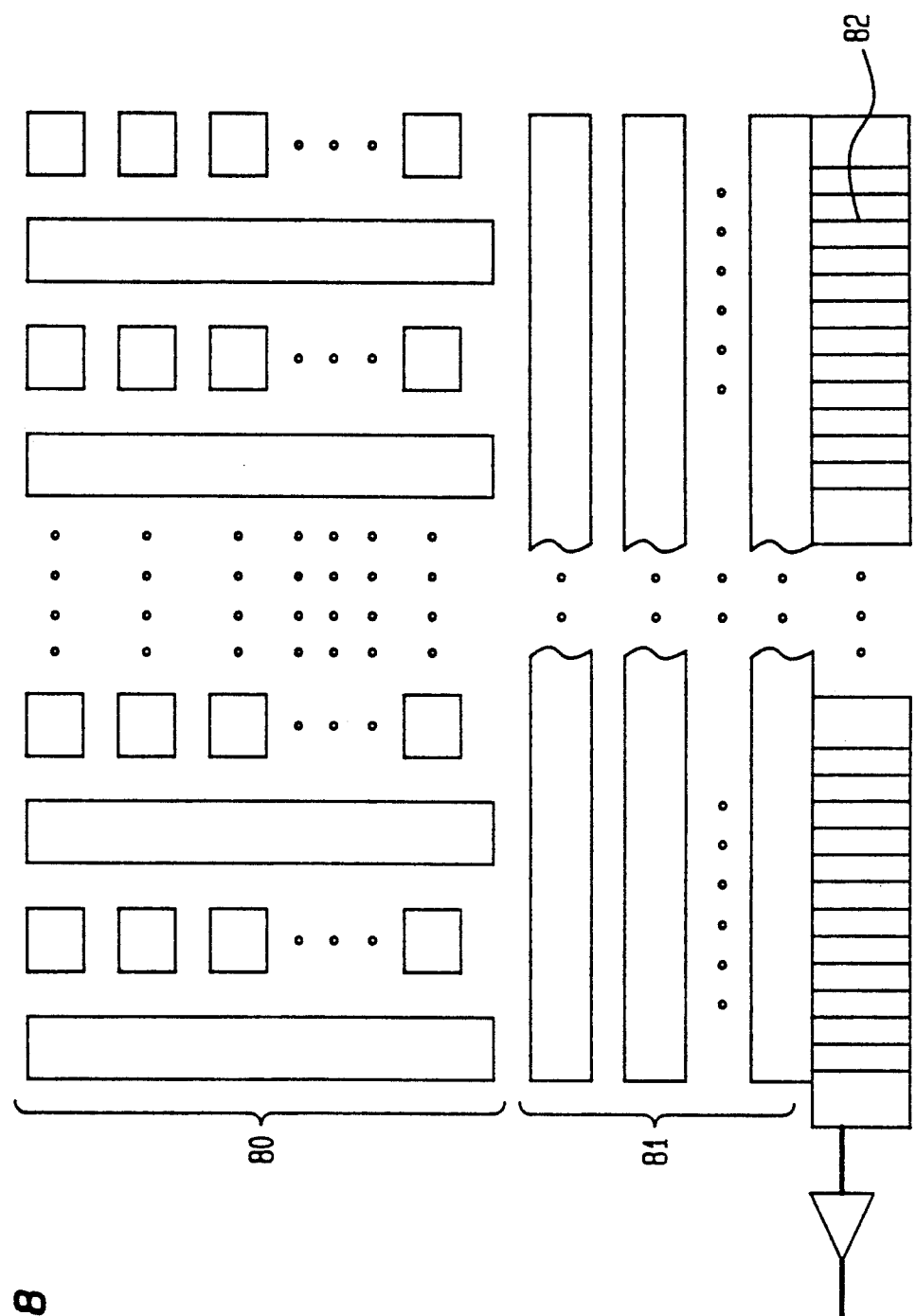
FIG. 8 shows a plan view of an FT (frame-transfer) solid-state imaging sensor.

FIG. 8 shows a plan view of an FT (frame-transfer) solid-state imaging sensor. Charge-coupled devices used in an FT imaging sensor are capable of being faster than the above-described charge-coupled device in a transfer speed. To achieve the fast transfer speed, a storage area is provided where signal charges are stored.

Usually, a signal charge in a photoelectric converter is transferred to an external device through a sense amplifier. In this case, the transfer speed of the charge-coupled device can be defined as the transfer time needed to transfer the signal charge to the sense amplifier. On the other hand, in the case of FT charge-coupled devices, signal charges can be transferred to an external device directly from the storage areas, thus achieving higher speed operation than conventional charge-coupled devices.

In FIG. 8, the numeral 80 indicates a pixel (picture element) area for photoelectric converter, 81 a storage area for storing photoelectric-converted signal charges temporarily, and 82 a horizontal charge transfer area. In the storage area 81, the silicon nitride layer is not removed in self alignment as in the case of the transistors in the peripheral circuit. As a result, the entire surface is covered with the silicon nitride layer. In this case, the surface states increase because of the stress of the silicon nitride layer. Also, since the silicon nitride layer has low permeability to hydrogen, adequate surface improvement cannot be achieved with hydrogen treatment performed in the fabrication process for the charge-coupled device.

Figure 9A:
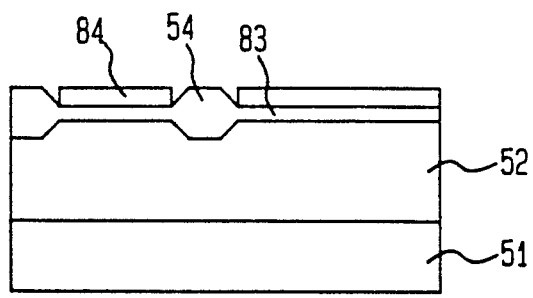
FIGS. 9A through 9E show a process sequence for fabricating a fifth embodiment of the present invention.

FIGS. 9A through 9E show a process sequence for fabricating a fifth embodiment of the present invention. First, boron ions are implanted into the entire surface of an n-type silicon substrate 51. An anneal process step is then performed to form a p-type diffusion layer 52. The ion implantation is performed with acceleration energy of 100 keV and dose of $5 \times 10^{11}/cm^2$. The anneal process step is performed for 10 hours at temperature 1200° C. The diffusion depth of the p-type diffusion layer 52 is about 5 μm. Next, the surface of the silicon substrate 51 is thermally oxidized to form a silicon oxide layer 83 of 50 nm thickness. After that, a silicon nitride layer 84 is formed on the silicon oxide layer 83 by using low-pressure CVD. The thickness of the silicon nitride layer is 120 nm. Thereafter, using a known photolithography technique, a resist pattern is formed over the entire surface except the area where an isolation oxide 54 is formed. Using the resist pattern as a mask, the silicon nitride layer 84 is etched away. Further, the silicon oxide layer 83 is etched to expose the surface of the silicon substrate 51. After that, the resist pattern is removed. The silicon substrate 51 with the silicon nitride layer 84 and silicon oxide layer 83 thus removed is then thermally oxidized to grow the isolation oxide (about 500 nm thickness) 54 called LOCOS, as shown in FIG. 9A.

The silicon nitride layer 84 is then removed by etching from the surface of the silicon substrate 51. Thereafter, using a known photolithography technique, a resist pattern (not shown) is formed on the region where a MIS transistor is formed. After that, phosphorus ions are implanted into the entire surface of the silicon substrate 51. The ion implantation is performed with acceleration energy of 100 keV and dose of $3 \times 10^{12}/cm^2$. After that, the resist pattern is removed.

Figure 9B:
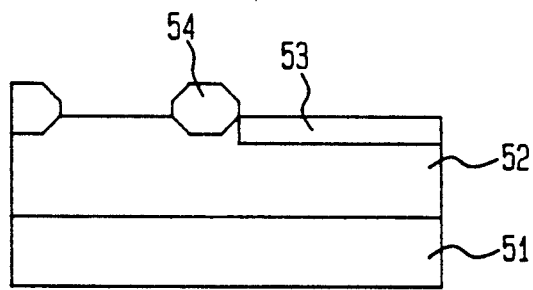

Further, an anneal process step is performed to form an n-type diffusion layer 53 which acts as the charge transfer channel. The n-type diffusion layer 53 is diffused to a depth of 0.5 μm. The silicon oxide layer 83 used as a protective film is then removed by etching, as shown in FIG. 9B. During the etching, the surface of the isolation oxide 54 is also etched down to depth equivalent to the thickness of the silicon oxide layer 83.

Next, the silicon substrate 51 is thermally oxidized to form a silicon oxide layer 56 in 80 nm thickness. Further, a silicon nitride layer 57 is grown to a thickness of 40 nm on the silicon oxide layer 56 by using low-pressure CVD. At this time, the thickness of the silicon oxide layer 56 can be chosen within the range of 10 nm to 200 nm, and the silicon nitride layer 57 within the range of 10 nm to 100 nm, the optimum thickness being within the respective ranges according to the characteristics of the charge-coupled device and to the circuit driving conditions. Thereafter, using a known photolithography technique, a resist pattern is formed having an opening corresponding to a peripheral circuit region where a MIS transistor is formed. Using the resist pattern as a mask, the silicon nitride layer 57 is removed by plasma etching. Thus, the silicon nitride layer 57 is removed from the region where the MIS transistor is formed.

Further, the silicon oxide layer 56 exposed in this region is removed by wet etching using a mixed solution of hydrofluoric acid and ammonium fluoride. It will be appreciated that plasma etching may be used to remove the silicon oxide layer 56. The silicon substrate 51 is now exposed in the region where the MIS transistor is formed. It will be appreciated that no deleterious effects will be caused to the subsequent steps if the etching of the silicon oxide layer 56 is performed to such a degree as to expose the surface of the silicon substrate 51 but to leave small portions of silicon oxide unetched. Also, prior to the wet etching of the silicon oxide layer 56, the silicon oxide layer 56 may be exposed to an oxygen plasma for cleaning the surface thereof, to facilitate the subsequent wet etching.

Figure 9C:
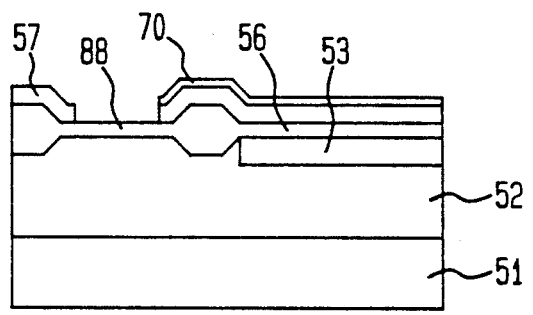

Next, the resist pattern is removed. Thereafter, thermal oxidation is performed to form a silicon oxide layer 68 on the exposed surface of the silicon substrate 51 in the peripheral circuit region, as shown in FIG. 9C.

In the buried-channel charge transfer region, a two-layer film consisting of the silicon oxide layer 56 and the silicon nitride layer 57 is already formed. Since the upper silicon nitride layer 57 has a slow oxidation rate, increasing the thickness of the silicon oxide layer 68, the gate insulating film for the MIS transistor, does not cause any adverse effects to the silicon nitride layer 57 and can therefore be adjusted as desired. During the thermal oxidation, a silicon oxide layer 70 of about 5 nm thickness is also grown on the silicon nitride layer 57 in the charge transfer region.

In the present embodiment, the dielectric strength, frequency, and noise characteristics were studied, and on the basis of the result of the study, the silicon oxide layer 68 is formed to a thickness of about 50 nm, which can optimize these characteristics.

Figure 9D:
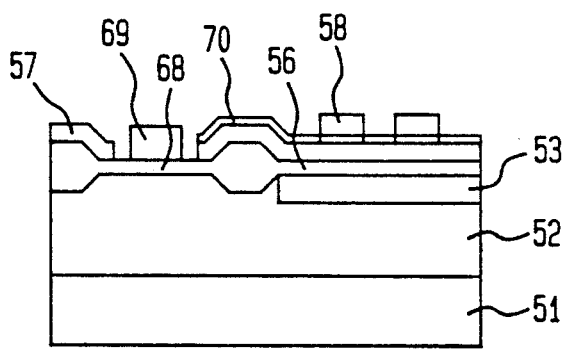

Thereafter, a first polysilicon film is deposited and doped with phosphorus for low resistivity. The first polysilicon film is then photo-etched to simultaneously form a first transfer gate electrode 58 of the charge-coupled device and a gate electrode 69 of the MIS transistor of the peripheral circuit as shown in FIG. 9D. For etching of the polysilicon film, the etching conditions are so set that the etch rate of the polysilicon film is faster than that of the underlying silicon nitride layer 57, thereby substantially blocking the etching of the silicon nitride layer 57.

Next, the polysilicon film is oxidized to form a silicon oxide layer 59 which serves to electrically isolate the first transfer gate electrode 58 from a second transfer gate electrode 60 subsequently. Thereafter, a second polysilicon film is deposited and doped with phosphorus for low resistivity. The second polysilicon film is then photo-etched to form the second transfer gate electrode 60.

Now, the transfer gate insulating film in the same thickness is provided both under the first transfer gate electrode 58 and under the second transfer gate electrode 60 formed in the second polysilicon film. That is, the transfer gate insulating film under both transfer gate electrodes has the total thickness of the silicon oxide layer 56 and the silicon nitride layer 57. This provides a uniform CCD channel in the operation of the charge-coupled device.

As described, in the charge-coupled device fabrication method of the present embodiment, the multilayer film consisting of the silicon oxide layer 56 and the silicon nitride layer 57 is removed before the formation of the silicon oxide layer 68 which acts as the gate insulating film for the peripheral circuit. This serves to simplify the process as compared with the prior art method.

Furthermore, the silicon nitride layer 57 remains in the upper layer of the charge transfer region when the process proceeds to the formation of the gate insulating film 68 for the peripheral circuit. In this situation, when oxidation is performed for the formation of the gate insulating film 68, no change is caused in the silicon nitride layer 57 itself but only the silicon oxide layer 70 in about 5 nm thickness is formed at the same time that the gate insulating film for the peripheral circuit is formed.

As a result, the insulating film in the same thickness is provided both below the first transfer gate electrode 58 and the second transfer gate electrode 60.

The second transfer gate electrode 60 is also formed by photoetching, but when etching is performed to form the second transfer gate electrode 60, the silicon nitride layer 57 is etched away in self-alignment together with the polysilicon film, except in the regions under the first transfer gate electrode 58 and second transfer gate electrode 60. For etching of the polysilicon film, the etching conditions are so set that the etch rate of the polysilicon film is close to that of the underlying silicon nitride layer 57.

Figure 9E:
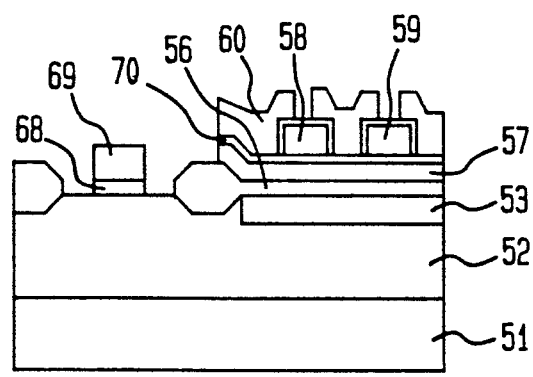
Figure 11:
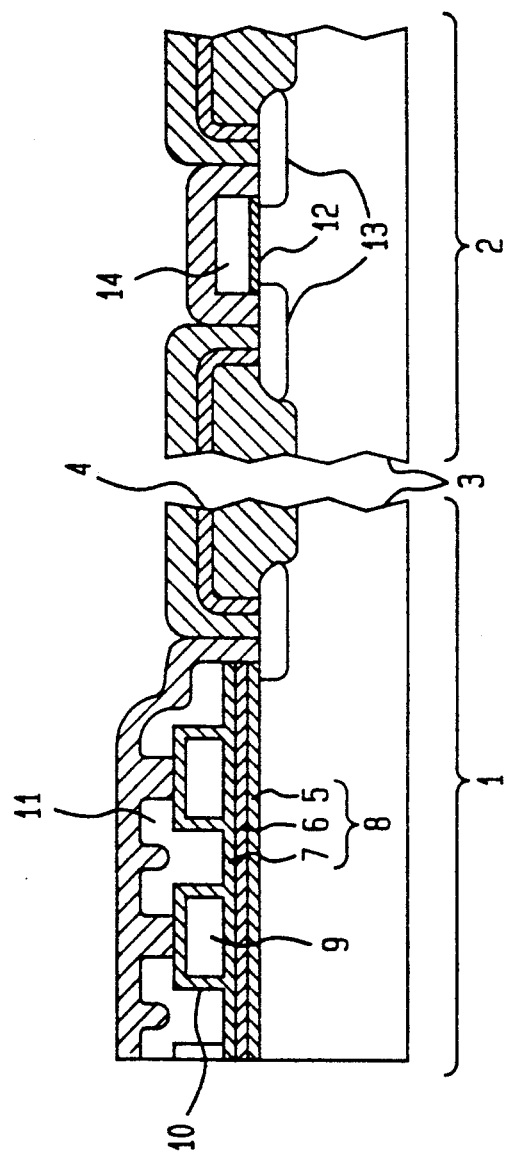
FIG. 11 shows a prior art charge-coupled device.
Figure 12A:
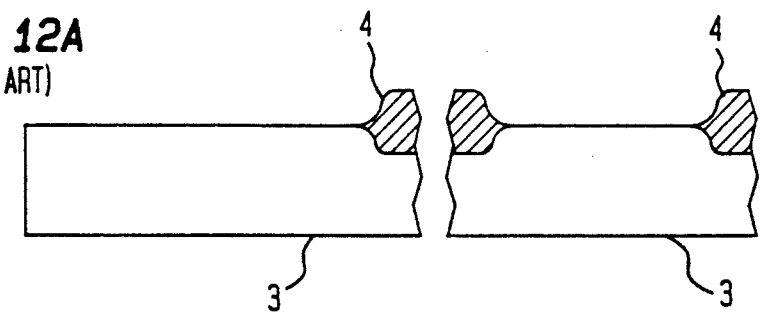
FIGS. 12A through 12E show the process sequence for the fabrication of the prior art charge-coupled device.
Figure 12B:
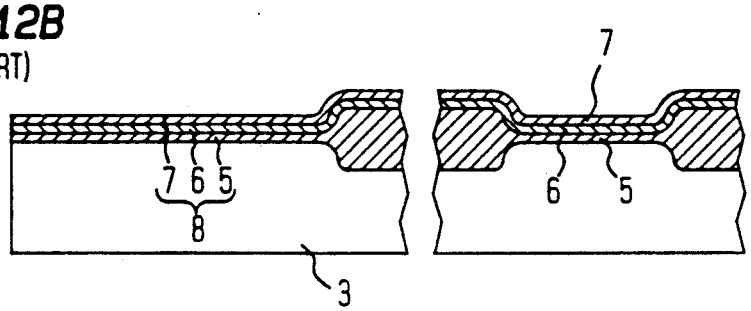
Figure 12C:
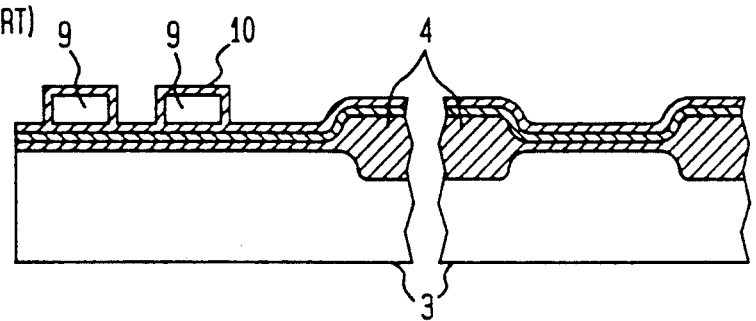
Figure 12D:
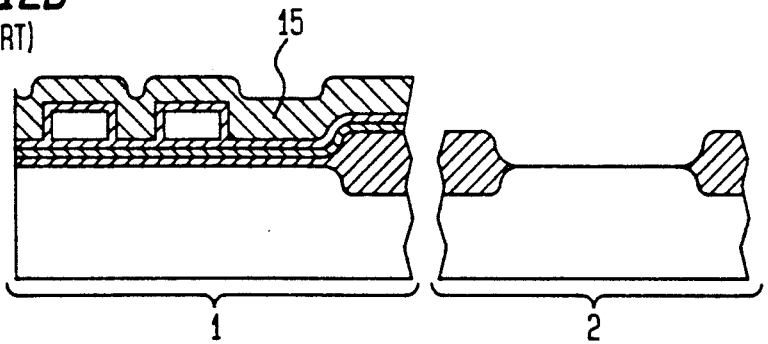
Figure 12E:
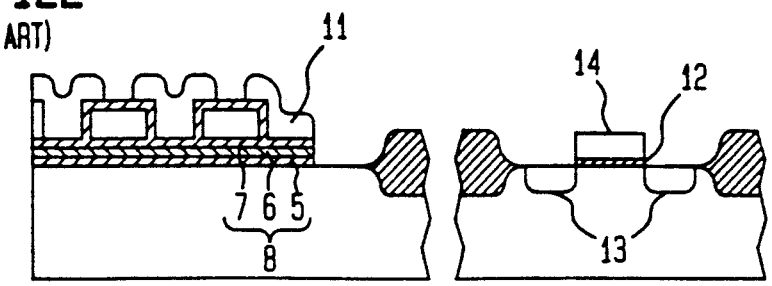

Removal of the silicon nitride layer 57 except in the regions under the transfer electrodes 58 and 60 serves to reduce the stress applied to the entire device, as shown in FIG. 9E. Also, the removal of the silicon nitride layer prevents the light falling on the photodiode from suffering attenuation when the charge-coupled device is used as a solid-state imaging sensor or the like. Thereafter, insulating films and aluminum wiring patterns are formed to complete the fabrication of the charge-coupled device.

According to the above process, in the CCD channel region, the transfer gate insulating film is formed from a multilayer film having good stability, and in the peripheral circuit region, the transistor is formed using the gate insulating film 68 having a reduced surface state.

Since a silicon oxide layer with reduced surface and trapping states is used for the surface-channel MOS transistor in the peripheral circuit, the final device is provided with better characteristics than charge-coupled devices using only ONO films which cause degradation in the noise characteristics due to the surface state density, the shifting of Vth and deterioration of conductance gm due to the film trap density, etc.

FIG. 10A through 10F show cross-sectional views illustrating the process sequence for fabricating a sixth embodiment of the present invention. A process sequence for forming two or more MIS transistors is described, the process being based on the fabrication process described in the fourth embodiment.

First, boron ions are implanted into the entire surface of an n-type silicon substrate 51. An anneal process step is then performed to form a p-type diffusion layer 52. The diffusion depth of the p-type diffusion layer 52 is about 5 μm. Next, the surface of the silicon substrate 51 is thermally oxidized to form a silicon oxide layer 83 in 50 nm thickness. After that, a silicon nitride layer 84 is formed on the silicon oxide layer 83 by using low-pressure CVD. The thickness of the silicon nitride layer 84 is 120 nm.

Thereafter, using a known photolithography technique, a resist pattern is formed over the entire surface except the area where an isolation oxide 54 is formed. Using the resist pattern as a mask, the silicon nitride layer 84 is etched away. Further, the silicon oxide layer 83 is etched to expose the surface of the silicon substrate 51. After that, the resist pattern is removed. The silicon substrate 51 with the silicon nitride layer 84 and silicon oxide layer 83 thus removed is then thermally oxidized to grow the isolation oxide 54. In the isolation oxide 54, an oxide film of about 500 nm thickness, called LOCOS, is formed, as shown in FIG. 10A.

The silicon nitride layer 84 is then removed by etching from the rest of the surface of the silicon substrate 51. Thereafter, using a known photolithography technique, a resist pattern (not shown) is formed on the region where a MIS transistor is formed. After that, ion implantation is performed over the entire surface of the silicon substrate 51. After that, the resist pattern is removed.

Further, an anneal process is performed to form an n-type diffusion layer 53 which acts as the transfer channel. The n-type diffusion layer 53 is diffused to a depth of 0.5 μm. The silicon oxide layer 83 used as a protective film is then removed by etching, as shown in FIG. 10B.

Next, the silicon substrate 51 is thermally oxidized to form a silicon oxide layer 56 in 80 nm thickness. Further, using low-pressure CVD, a silicon nitride layer 57 is grown to a thickness of 40 nm on the silicon oxide layer 56.

Thereafter, using a known photolithography technique, a resist pattern (not shown) is formed having an opening corresponding to a peripheral circuit region where a first MIS transistor is formed. Using the resist pattern as a mask, the silicon nitride layer 57 is removed by plasma etching. Thus, the silicon nitride layer 57 is removed from the region where the first MIS transistor is formed.

Further, the silicon oxide layer 56 exposed in this region is removed by wet etching using a mixed solution of hydrofluoric acid and ammonium fluoride. It will be appreciated that plasma etching may be used to etch the silicon oxide layer 56. The silicon substrate 51 is now exposed in the region where the MIS transistor is formed. Next, the resist pattern is removed (FIG. 10C).

Thereafter, thermal oxidation is performed to form a silicon oxide layer 71 on the exposed surface of the silicon substrate 51. In the buried-channel charge transfer region, a two-layer film consisting of the silicon oxide layer 56 and the silicon nitride layer 57 is already formed. Since the upper silicon nitride layer 57 has a slow oxidation rate, increasing the thickness of the silicon oxide layer 71, the gate insulating film for the MIS transistor, does not cause any adverse effects to the silicon nitride layer 57 and can therefore be adjusted as desired. In this embodiment, the silicon nitride layer 57 is grown to a thickness of 50 nm. During the thermal oxidation, a silicon oxide layer 70 of about 5 nm thickness is also grown on the silicon nitride layer 57 in the charge transfer region, as shown in FIG. 10D.

Thereafter, a first polysilicon film is deposited and doped with phosphorus for low resistivity. The first polysilicon film is then photo-etched to simultaneously form a first transfer gate electrode 58 of the charge-coupled device and a gate electrode 72 of the MIS transistor in the peripheral circuit. At this time, the silicon oxide layer 71 is also etched to form the gate oxide film for the first MIS transistor, as shown in FIG. 10D.

After that, using a known photolithography technique, a resist pattern (not shown) is formed having an opening corresponding to a region where a second MIS transistor is formed. Using the resist pattern as a mask, the silicon nitride layer 57 is removed by plasma etching. Thus, the silicon nitride layer 57 is removed from the region where the second MIS transistor is formed.

Further, the silicon oxide layer 56 exposed in this region is removed by wet etching using a mixed solution of hydrofluoric acid and ammonium fluoride. The silicon substrate 51 is now exposed in the region where the MIS transistor is formed. Next, the resist pattern is removed. Thereafter, thermal oxidation is performed to form a silicon oxide layer 73 on the exposed surface of the silicon substrate 51. During this oxidation process, the polysilicon film as the transfer electrode 58 is also oxidized to form a silicon oxide layer 59, which serves to electrically isolate the first transfer electrode from a second transfer electrode subsequently.

At this time, the silicon oxide layer 70 is formed in the regions of the buried-channel charge transfer block where the first transfer electrode 58 is not formed. The silicon oxide layer 70 is further grown by the formation of the silicon oxide layer 73, the gate insulating film for the second MIS transistor. However, in this case also, increasing the film thickness does not adversely affect the underlying silicon nitride layer 57 which has a slow oxidation rate. This allows the thickness of the silicon oxide layer 73, the gate insulating film for the MIS transistor, to be adjusted as desired. In this embodiment, the thickness of the silicon oxide layer 73 is set to 80 nm.

Thereafter, a second polysilicon film is deposited and doped with phosphorus for low resistivity. The second polysilicon film is then photo-etched to simultaneously form a second transfer gate electrode 60 of the charge-coupled device and a gate electrode 74 in the peripheral circuit. At this time, the silicon oxide layer 73 is also etched to form the gate oxide film for the second MIS transistor (FIG. 10E).

Next, the second gate electrode 74 is formed by photoetching. At the same time, the silicon nitride layer is etched away in self-alignment except in the regions under the first transfer gate electrode 58 and second gate electrode 60 which are used as a mask for the etching (FIG. 10F).

As described, in the formation of the peripheral circuit, films having two different thicknesses are provided, one being 50 nm in the first peripheral circuit region and the other being 80 nm in the second peripheral circuit region, the gate insulating films being best fit for forming surface-channel transistors having reduced surface states and trapping states. In this embodiment, silicon oxide layers of 50 nm and 80 nm thicknesses are formed, but the oxide film thickness can be changed within the range that can provide the desired dielectric strength. In the final step, insulating films and aluminum wiring patterns are formed to complete the fabrication of the charge-coupled device.

In the case of a device with a three or more level gate also, the silicon oxide layer can be formed after removing the silicon nitride layer from the peripheral circuit in the same manner as described above.

As described, since the silicon nitride layer is removed from the peripheral circuit, the MIS transistors can be formed in regions that are least susceptible to the effect of surface states. This prevents Vt from being affected by the stress. Also, since the gate insulating film for the peripheral circuit is simultaneously formed in the charge-transfer region topped with the silicon nitride layer, the process is simplified and the gate insulating film thickness can be chosen to meet specific purposes. Furthermore, the first transfer electrode in the charge transfer block and the gate electrode in the peripheral circuit are formed in self-alignment, which also serves to simplify the process. Moreover, the silicon nitride layer remains in the upper layer of the charge transfer region when the process proceeds to the formation of the gate insulating film for the peripheral circuit. In this situation, when oxidation is performed to form the gate insulating film, no change is caused in the silicon nitride layer itself but only a silicon oxide layer in about 5 nm thickness is formed at the same time that the gate insulating film for the peripheral circuit is formed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method of fabricating a charge-coupled device, said method comprising the steps of:
    forming a first silicon oxide layer on a top surface of a semiconductor substrate, said top surface having a charge transfer region and a peripheral circuit region;
    forming a silicon nitride layer on said first silicon oxide layer;
    forming at least one window through said silicon nitride layer and said silicon oxide layer, said window exposing part of said peripheral circuit region;
    oxidizing said part of the peripheral circuit region and a surface of said silicon nitride for forming a second silicon oxide layer on said part of the peripheral circuit region and on said silicon nitride layer, thereby forming a transfer gate insulating film including said first silicon oxide layer, said silicon nitride layer and said second silicon oxide layer; and
    depositing a polysilicon film on said second silicon oxide layer, and patterning said polysilicon film into a plurality of transfer gate electrodes and at least one gate electrode, said transfer gate electrodes being over said charge transfer region and said at least one gate electrode being over said part of the peripheral circuit region.

2. A method of fabricating a charge-coupled device comprising the steps of:
    forming a field isolation oxide at a region of a top surface of a semiconductor substrate for dividing said top surface into a charge transfer region and a peripheral circuit region by said field isolation oxide;
    forming a first silicon oxide layer on said top surface of said semiconductor substrate;
    forming a silicon nitride layer on said first silicon oxide layer;
    removing a portion of said silicon nitride layer, said portion being at said peripheral circuit region in said top surface of the semiconductor substrate, for exposing a surface of said first silicon oxide layer;
    removing a portion of said first silicon oxide layer, said portion being at said periphery circuit region of said top surface of the semiconductor substrate;
    forming a second silicon oxide layer on said silicon nitride layer for forming a transfer gate insulating film including said first silicon oxide layer, said silicon nitride layer and said second silicon oxide layer;
    forming a plurality of first transfer gate electrodes on said transfer gate insulating film and simultaneously forming a gate electrode on said second silicon oxide layer;
    forming a third silicon oxide layer at surfaces of said first transfer gate electrodes by oxidizing said surfaces of the first transfer gate electrodes; and
    forming a plurality of second transfer gate electrodes on said transfer gate insulating film and said third silicon oxide layer.

3. A method of fabricating a charge-coupled device comprising the steps of:
    forming a field isolation oxide at a region of a top surface of a semiconductor substrate for dividing said top surface into a charge transfer region and a peripheral circuit region by said field isolation oxide;
    forming a first silicon oxide layer on said top surface of said semiconductor substrate;

forming a silicon nitride layer on said first silicon oxide layer;

removing a first portion of said silicon nitride layer, said first portion being at said periphery circuit region of said top surface of said semiconductor substrate, for exposing a surface of said first silicon oxide layer;

removing a first portion of said first silicon oxide layer for exposing a surface of the semiconductor substrate, said first portion being at said periphery circuit region of said top surface of the semiconductor substrate;

forming a second silicon oxide layer on said silicon nitride layer for forming a transfer gate insulating film including said first silicon oxide layer, said silicon nitride layer and said second silicon oxide layer;

forming a plurality of first transfer gate electrodes on said transfer gate insulating film and simultaneously forming a first gate electrode on said second silicon oxide layer;

removing a second portion of said silicon nitride layer, said second portion being at said periphery circuit region of said top surface of the semiconductor substrate, for exposing a surface of said first silicon oxide layer;

removing a second portion of said first silicon oxide layer for exposing a surface of said semiconductor substrate, said second portion being at said periphery circuit region in said top surface of the semiconductor substrate;

forming a third silicon oxide layer at surfaces of said first transfer gate electrodes by oxidizing said surfaces of the first transfer gate electrodes; and forming a plurality of second transfer gate electrodes on said transfer gate insulating film and said third silicon oxide layer, and simultaneously forming a second gate electrode on said second silicon oxide layer.

* * * * *